United States Patent
Meguro et al.

(10) Patent No.: US 9,059,422 B2
(45) Date of Patent: Jun. 16, 2015

(54) SUBSTRATE WITH TRANSPARENT CONDUCTIVE FILM AND THIN FILM PHOTOELECTRIC CONVERSION DEVICE

(75) Inventors: Tomomi Meguro, Settsu (JP); Kenji Yamamoto, Settsu (JP)

(73) Assignee: KANEKA CORPORATION, Osaka-shi (JP)

( * ) Notice: Subject to any disclaimer, the term of this patent is extended or adjusted under 35 U.S.C. 154(b) by 904 days.

(21) Appl. No.: 13/147,586

(22) PCT Filed: Jan. 29, 2010

(86) PCT No.: PCT/JP2010/051259
§ 371 (c)(1),
(2), (4) Date: Aug. 2, 2011

(87) PCT Pub. No.: WO2010/090142
PCT Pub. Date: Aug. 12, 2010

(65) Prior Publication Data
US 2011/0290322 A1    Dec. 1, 2011

(30) Foreign Application Priority Data

Feb. 3, 2009   (JP) .................................. 2009-022642
Dec. 28, 2009  (JP) .................................. 2009-298265

(51) Int. Cl.
*H01L 31/0224*    (2006.01)
*H01L 21/283*     (2006.01)
(Continued)

(52) U.S. Cl.
CPC .... *H01L 51/5203* (2013.01); *H01L 31/022466* (2013.01); *H01L 31/02366* (2013.01);
(Continued)

(58) Field of Classification Search
USPC .......................................... 136/256; 438/609
See application file for complete search history.

(56) References Cited

U.S. PATENT DOCUMENTS 4,694,116 A    9/1987  Hayashi et al.
6,297,443 B1 * 10/2001  Nakajima et al. .............. 136/258
(Continued)

FOREIGN PATENT DOCUMENTS

JP    61216489 A   9/1986
JP    1132004 A    5/1989
(Continued)

OTHER PUBLICATIONS

Machine translation of JP H09-139515.*
(Continued)

*Primary Examiner* — Robert Carpenter
(74) *Attorney, Agent, or Firm* — Alleman Hall McCoy Russell & Tuttle LLP

(57) ABSTRACT

Disclosed is a substrate with a transparent conductive film, wherein an underlying layer and a transparent conductive film are arranged in this order on a transparent insulating substrate. The transparent conductive film-side surface of the underlying layer is provided with a pyramid-shaped or inverse pyramid-shaped irregular structure, and the transparent conductive film comprises a first transparent electrode layer which is formed on the underlying layer and a second transparent electrode layer which forms the outermost surface of the transparent conductive film. By forming a zinc oxide layer that serves as the second transparent electrode layer by a reduced pressure CVD method, a substrate with a transparent conductive film that is provided with an irregular structure smaller than that of the underlying layer can be obtained. The substrate with a transparent conductive film can improve the conversion efficiency of a photoelectric conversion device through an increased light trapping effect.

17 Claims, 15 Drawing Sheets

(51) Int. Cl.
*H01L 51/52* (2006.01)
*H01L 31/0236* (2006.01)
*H01L 31/0392* (2006.01)
*H01L 31/0745* (2012.01)
*H01L 31/076* (2012.01)
*H01L 31/077* (2012.01)
*H01L 31/18* (2006.01)
*H05B 33/28* (2006.01)

(52) U.S. Cl.
CPC ...... *H01L31/03921* (2013.01); *H01L 31/0745* (2013.01); *H01L 31/076* (2013.01); *H01L 31/077* (2013.01); *H01L 31/1884* (2013.01); *H01L 51/5268* (2013.01); *H05B 33/28* (2013.01); *Y02E 10/548* (2013.01)

(56) References Cited

U.S. PATENT DOCUMENTS

| | | | |
|---|---|---|---|
| 6,930,025 | B2 | 8/2005 | Nakayama et al. |
| 2002/0157703 | A1 | 10/2002 | Nakayama et al. |
| 2007/0169805 | A1 | 7/2007 | Sasaki et al. |
| 2008/0230947 | A1* | 9/2008 | Chou et al. .................. 264/225 |
| 2010/0024862 | A1 | 2/2010 | Tawada |

FOREIGN PATENT DOCUMENTS

| | | | |
|---|---|---|---|
| JP | 2058876 | A | 2/1990 |
| JP | 3125481 | A | 5/1991 |
| JP | 9139515 | A | 5/1997 |
| JP | 11233800 | A | 8/1999 |
| JP | 2000208788 | A | 7/2000 |
| JP | 2000252500 | A | 9/2000 |
| JP | 2002352956 | A | 12/2002 |
| JP | 2003115601 | A | 4/2003 |
| JP | 2005311292 | A | 11/2005 |
| JP | 2005347490 | A | 12/2005 |
| JP | 2008153570 | A | 7/2008 |
| WO | 2008062685 | A1 | 5/2008 |

OTHER PUBLICATIONS

ISA The International Bureau of WIPO, International Preliminary Report on Patentability for International Application No. PCT/JP2008/051259, Aug. 18, 2011, 9 pages.

ISA Japanese Patent Office, International Search Report of PCT/JP2010/051259, Mar. 2, 2010, 4 pages.

* cited by examiner

5 μm

5μm

5μm

SUBSTRATE WITH TRANSPARENT CONDUCTIVE FILM AND THIN FILM PHOTOELECTRIC CONVERSION DEVICE

TECHNICAL FIELD

The invention provides a means capable of improving the conversion efficiency of a thin film photoelectric conversion device, and relates in particular to an improvement in a transparent conductive film for a thin film photoelectric conversion device.

BACKGROUND ART

In recent years, attention has been paid to thin film photoelectric conversion devices, which have little problem about resources, and developments thereof have been actively made in order to reduce the costs of photoelectric conversion devices compatible with high efficiency thereof. A thin film silicon solar cell, which is one of the thin film photoelectric conversion devices, can be formed on a large-area glass substrate or stainless steel substrate at low temperature; thus, it can be expected that costs thereof are reduced. In order to improve the conversion efficiency of the thin film silicon solar cell, attempts for increasing the optical path of light incident into its photoelectric conversion layer have been hitherto developed or realized as a method for increasing the absorption quantity of the sunlight.

In the case of, for example, a thin film silicon solar cell wherein a glass substrate is used, the scattering of incident light is increased by a method of depositing a tin oxide ($SnO_2$) film as a transparent electrode by thermal CVD, thereby creating a texture (microscopic structure) that may be of various types; a method of etching the surface of the transparent electrode, thereby forming a texture; or a method of depositing a layer having an irregular structure between the transparent electrode and the glass substrate.

From the viewpoint of aiming for compatibility between reducing the costs of thin film photoelectric conversion devices and high efficiency thereof, multi-junction type photoelectric conversion devices have been developed, in which two or more photoelectric conversion units having absorbable wavelength ranges different from each other are stacked, in order to make good use of a main wavelength range (400 to 1200 nm) of sunlight. For example, a double-junction type thin film silicon solar cell has been put into practical use, in which an amorphous silicon photoelectric conversion unit using light having wavelengths up to about 800 nm and a crystalline silicon photoelectric conversion unit using longer wavelengths than those used by the amorphous silicon are stacked.

For a substrate with a transparent conductive film used for such a multi-junction type photoelectric conversion device, a technique of scattering light rays having a long wavelength range by a texture having irregularities relatively large in size, and scattering light rays having a shorter wavelength range by a texture having irregularities relatively small in size is suggested, thereby widening the range of wavelengths of light to be scattered to improve photoelectric conversion properties of the device.

According to, for example, Patent Document 1, in a method for forming such textures, fine structures are formed in a surface of a glass by mechanical polishing. However, the method has drawbacks that a surface having fine irregularities is not easily obtained, and the area of the surface is not easily made large, either.

According to Patent Document 2, an irregular structure is formed by etching a surface of a transparent electrode. However, only a crater-shaped-irregular structure can be formed. Thus, it cannot be stated that this method is favorable for forming a pyramidal or inverse-pyramidal irregular structure, which is advantageous for light scattering.

According to Patent Document 3, a pyramidal or inverse-pyramidal irregular structure is formed in a glass substrate. However, high temperature is required for softening the glass in order to form the irregular structure in the glass. Moreover, the size of the recesses and projections is limited so that satisfactory effects are not necessarily obtained for light scattering of wavelengths in a wide range.

According to Patent Document 4, a pyramidal or inverse-pyramidal irregular structure is formed by applying a sol-form transparent electrode onto a substrate. However, in the same manner as described above, the size of the each irregular structure is limited. Moreover, because of the use of the sol-form electrode, a high-quality film is not easily formed.

In the meantime, a method of forming irregularity-species different from each other size in a transparent electrode is suggested, thereby widening the range of wavelengths of light to be scattered. For example, Patent Document 5 proposes a method of forming a texture with small irregularity-size in the surface of the transparent conductive film, in which a discontinuous first layer having large irregularity-size, which is made of a first oxide material with a low electroconductivity, is deposited on a flat substrate, and then a continuous layer made of a second oxide material is deposited thereon by normal-pressure CVD. More specifically, according to Patent Document 5, an amorphous $SiO_2$ layer, as an underlying layer, is deposited on a discontinuous texture composed of a first oxide and a substrate, to give a thickness of 2 to 40 nm, and then an $SnO_2$ film doped with fluorine is deposited thereon by normal pressure CVD, to form a second oxide layer.

As described above, according to Patent Document 5, depositing a different oxide layer made of amorphous $SiO_2$ or the like is necessary to form the small size texture in the transparent conductive film surface. Thus, the step of producing the transparent conductive film is complicated. As shown in a scanning electron microscope (SEM) photograph in FIG. 14, the shape of the irregularities in the texture large in irregularity-size in the transparent conductive film of Patent Document 5 is not pyramidal. Further the texture formed of the first oxide material is discontinuous, and therefore, the surface of the transparent conductive film has many flat areas. For these reasons, it is not necessarily stated that a structure advantageous for a light scattering layer is formed. Furthermore, according to Patent Document 5, the irregularity-size of the texture in the surface of the transparent conductive film is large as shown in FIG. 14. Thus, in a semiconductor layer, such as a silicon layer, which is deposited on the transparent conductive film, defects are easily generated from the recesses as nucleation points. Thus, there remains a problem that, in particular, the open circuit voltage (Voc) is reduced.

PRIOR ART DOCUMENTS

Patent Documents

Patent Document 1: JP-A-2000-208788
Patent Document 2: JP-A-11-233800
Patent Document 3: JP-A-2-58876
Patent Document 4: JP-A-2008-153570
Patent Document 5: JP-A-2005-347490

SUMMARY OF THE INVENTION

Problems to be Solved by the Invention

As described above, many attempts have been made to improve the conversion efficiency of the photoelectric conversion device by forming a texture in a substrate surface or a transparent conductive film surface of a substrate with a transparent conductive film, thereby scattering light efficiently. However, there has not been obtained any substrate a with transparent conductive film capable of producing a sufficient light scattering effect onto a thin film photoelectric conversion device making good use of light in a wide wavelength range, such as a multi-junction type photoelectric conversion device.

A cause for that is a phenomenon that the shape of the texture of the transparent conductive film is affected by the substrate surface, or by the shape of the texture of an underlying layer on the substrate. Since the substrate surface or the texture of the underlying layer affects the shape of the texture of the transparent conductive film deposited thereon, it is difficult to control the respective sizes of irregularities in the two textures independently. For example, when the substrate surface or the underlying layer has a texture with large irregularity-size, the surface of transparent conductive film deposited thereon also has a texture structure with large irregularity-size. Thus, it is difficult to form a texture small in irregularity-size.

Furthermore, the transparent conductive film is deposited by a thin-film deposition method such as sputtering, vapor deposition, or CVD. The material and surface shape of the underlying layer, the material, deposition method and deposition conditions of the transparent conductive film, and other factors affect crystal growth of a conductive metal oxide. The phenomenon that the predictability thereof is low is a cause for the difficulty in the formation of a desired texture in the surface of the transparent conductive film.

The present invention is made to solve the above-mentioned problems of the prior art by controlling a texture structure of a substrate with transparent conductive film and thereby increasing the optical path of light incident into a photoelectric conversion layer over a wide wavelength range so as to obtain a photoelectric conversion device high in conversion efficiency.

Means for Solving the Problems

The invention relates to a substrate with transparent conductive film including a transparent insulating substrate, and further including an underlying layer and a transparent conductive film stacked in this order on the insulating substrate, and a production method thereof. In the substrate with transparent conductive film of the invention, the underlying layer has a pyramidal or inverse-pyramidal irregular structure formed in a transparent conductive film-side surface thereof. The transparent conductive film includes a first transparent electrode layer formed directly on the underlying layer, and a second transparent electrode layer which forms the outermost surface of the transparent conductive film. In a preferred embodiment of the invention, the second transparent electrode layer is formed directly on the first transparent electrode layer.

The second transparent electrode layer is preferably a zinc oxide layer deposited by low-pressure CVD. Further the surface of the second transparent electrode layer, namely the surface of the transparent conductive film, has a smaller irregular structure than the underlying layer.

The irregular structure of the underlying layer is preferably formed by a nano-imprinting method, and is more preferably formed by a nano-imprinting method which is a method of transcribing an irregular structure formed by etching a monocrystalline silicon substrate to the underlying layer. An underlying layer comprising $SiO_2$ as a main component is preferably used as the underlying layer.

It is preferable that the pyramidal shape or inverse-pyramidal shape irregular structure is continuously formed. It is further preferable that the top-bottom distance of the irregular structure of the underlying layer is larger than that of the irregular structure of the transparent conductive film. In addition the distance between tops of the projections of the irregular structure of the underlying layer is preferably larger than that between tops of the projections of the transparent conductive film. About the irregular structure of the underlying layer, the top-bottom distance is preferably in the range from 100 to 1000 nm, and the distance between the tops of the projections is preferably in the range from 200 to 2000 nm. About the irregular structure of the transparent conductive film, the top-bottom distance is preferably in the range from 20 to 400 nm, and the distance between the tops of the projections is preferably in the range from 50 to 1000 nm.

In a preferable embodiment of the invention, the first transparent electrode layer comprises indium-titanium composite oxide.

The zinc oxide layer as the second transparent electrode layer is preferably deposited by low-pressure CVD method. When the second transparent electrode layer is deposited by low-pressure CVD method, the surface of the transparent conductive film may have the irregular structure with above mentioned top-bottom distance and the distance between tops.

In an embodiment of a method for producing the substrate with transparent conductive film of the invention, the first transparent electrode layer and the second transparent electrode layer are each deposited by low-pressure CVD. Deposition is temporarily interrupted after the deposition of the first transparent electrode layer, and subsequently the second transparent electrode layer 4b is deposited. In another embodiment of the production method of the invention, the first transparent electrode layer is deposited by sputtering method.

The substrate with transparent conductive film of the invention can be preferably used as a substrate for a photoelectric conversion device or a luminescent element. The substrate with transparent conductive film of the invention is preferably used for, for example, a multi-junction type thin film photoelectric conversion device including a transparent conductive film, and further including two or more photoelectric conversion units having absorbable wavelength ranges different from each other, and a back electrode that are stacked in this order on the transparent conductive film. The substrate with transparent conductive film can be preferably used for, in particular, a multi-junction type thin film photoelectric conversion device wherein at least one amorphous silicon photoelectric conversion unit and a crystalline silicon photoelectric conversion unit, as photoelectric conversion units, are arranged in this order from the light incident side.

A luminescent element using the substrate with transparent conductive film of the invention is, for example, an organic EL element in which a luminescent layer formed of an organic thin film layer is arranged on the transparent conductive film.

Effects of the Invention

According to the invention, a substrate with transparent conductive film is obtained in which an underlying layer 2 having a irregular structure and a transparent conductive film 4 are stacked in this order on a transparent insulating substrate, and the top-bottom distance (H1) of the irregular structure of the underlying layer is larger than the top-bottom distance (H2) of the irregular structure of the transparent conductive film.

For example, nano-imprinting method is used in which a mold 3 of a silicon wafer etched with an acid or alkali is transcribed onto the underlying layer over the transparent insulating substrate to form an irregular structure in the underlying layer 2. By the nano-imprinting method, a texture with large irregularities is formed therein. Since this large irregularity-size texture has a pyramidal or inverse-pyramidal irregularity structure, light scattering of incident light having long wavelengths is increased on the interface between the underlying layer 2 and the transparent conductive film 4 while reflection on the interface is decreased. The transparent conductive film 4 is composed of at least two transparent electrode layers, and the outermost layer of the layers, i.e., a second transparent electrode layer 4b is deposited by low-pressure CVD; therefore, a texture with small irregularities is formed in the surface of the transparent conductive film. Due to this small irregularity-size texture, light rays having a shorter wavelength range are scattered on the interface between the transparent conductive film 4 and the photoelectric conversion unit.

For this reason, a thin film photoelectric conversion device using the substrate with transparent conductive film of the invention produces a highly advantageous effect of confining incident light over wide wavelength range, so that a photoelectric current is increased therein. The invention contributes largely to, in particular, a multi-junction type photoelectric conversion device in which two or more photoelectric conversion units having absorbable wavelength ranges different from each other are stacked. Additionally, in the substrate with a transparent conductive film of the invention, the size of the irregularities in the outermost surface of the transparent conductive film is small. Thus, in a semiconductor layer deposited on the transparent conductive film, defects are prevented from being generated from the recesses, as nucleation points, so that the open circuit voltage (Voc) of the device is not easily reduced. By the combined effect of the restraint on the reduction in the open circuit voltage with the photoelectric-current-increase, the conversion efficiency of the photoelectric conversion device is improved.

In the invention, zinc oxide is deposited as the second transparent electrode layer 4b, which is the outermost layer of the transparent conductive film 4, by low-pressure CVD, whereby a texture with a small irregularity size is formed in the surface of the transparent conductive film 4. In this way, the texture with small irregularity size can easily be produced, and therefore a substrate with transparent conductive film which has a light scattering effect in a wide wavelength range can be produced at low costs.

EMBODIMENTS FOR CARRYING OUT THE INVENTION

Figure 1:
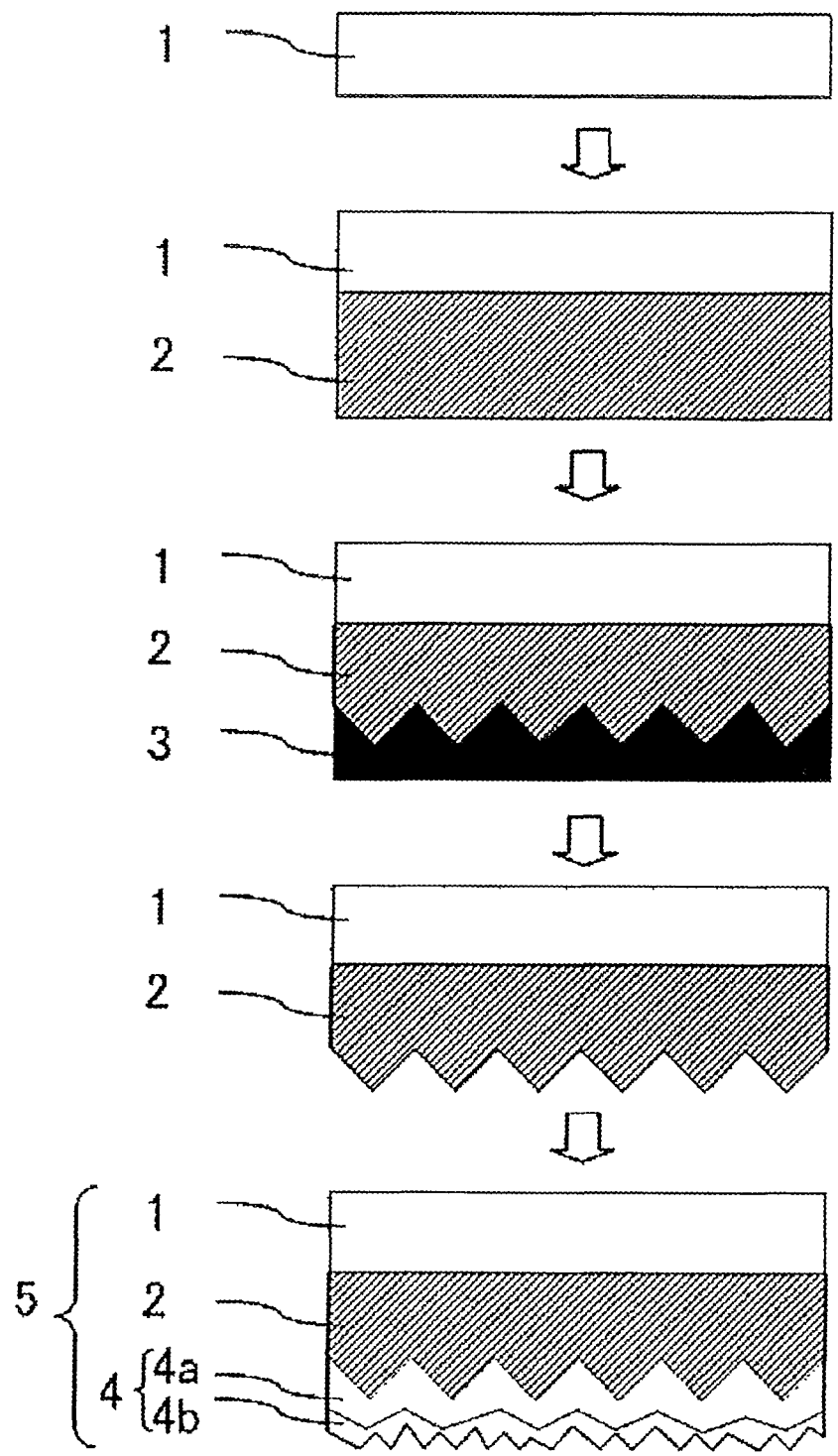
FIG. 1 is a process chart of forming a substrate with transparent conductive film of an embodiment of the invention.

Hereinafter, embodiments of the invention will be described with reference to the drawings. FIG. 1 is a view which schematically illustrates the step of forming an irregular structure about an embodiment of the substrate with transparent conductive film of the invention.

An underlying layer 2 is formed on a transparent insulating substrate 1. The transparent insulating substrate 1 may be a plate-like member or a sheet-like member made of glass, a transparent resin or some other. The material which forms the underlying layer 2 may be an inorganic sol-gel material, or an organic/inorganic hybrid material to which an oxide of a metal such as titanium, or an alkoxide is added. An inorganic sol-gel material is desired. Particularly desired is a sol-gel material made of $SiO_2$ since the material, in the same manner as glass, has a high transmittance and small light absorption loss. The sol-gel material made of $SiO_2$ may be specifically spin-on-glass (SOG) material. The sol-gel material is preferably a material made mainly of a tetraalkoxysilane or an alkylalkoxysilane.

The method for forming the underlying layer on the transparent insulating substrate made of glass or some other may be a dipping, spin coating, bar coating, spraying, die coating, roll coating, or flow coating method, or some other method. In order to form the underlying layer in particular easily and evenly, a roll coating or spin coating method is preferred.

Figure 2A:
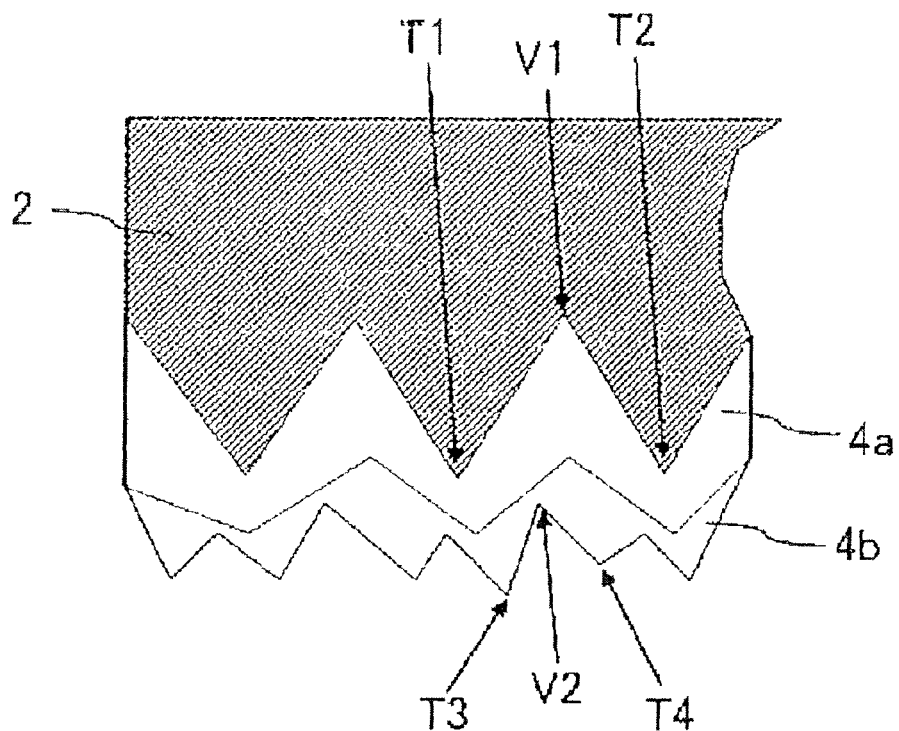
FIG. 2A is a schematic sectional view of the substrate with transparent conductive film of the embodiment of the invention.

As illustrated schematically in FIG. 2A, a texture having pyramidal or inverse-pyramidal irregularities is formed in the underlying layer 2. When the irregularities of the texture are pyramidal in shape or inverse-pyramidal in shape, an effect of decreasing interfacial reflection and simultaneously increasing light scattering can be obtained. It is preferred that the pyramidal or inverse-pyramidal irregularities are formed continuously. In connection with the word "continuously", it is preferred that the irregularity structure does not substantially have any flat region so that the projections are adjacent to each other. When a texture having continuous irregularities is formed, the area of flat regions is small and the area which contributes to light scattering increases, so that a high light-confining effect is realized.

The method for forming the texture in the underlying layer is not particularly limited. The texture is preferably formed by a nano-imprinting method of transcribing a fine structure of a mold 3 into the underlying layer 2. According to the nano-imprinting method, the fine-structure-formed mold 3 is pushed against the substrate on which the underlying layer 2 is formed, thereby forming a fine structure in the underlying layer. When the nano-imprinting method is adopted, a pattern reverse to the structure of the mold is formed in the underlying layer; thus, it is necessary to form, in the mold 3, a structure reverse to a pattern desired to be formed in the underlying layer. This method is effective as a method for forming a desired fine structure with a good precision and a high reproducibility since transcription in a nano-order can be attained.

The mold 3 may be a silicon substrate having a pyramidal or inverse-pyramidal texture formed by a known technique, such as a technique of etching a monocrystalline silicon substrate with an acid or alkali.

When the substrate is etched with an aqueous alkali solution, for example, the method for forming the texture structure on the silicon substrate may be the following: a difference in etching rate between the (100) plane and the (111) plane is applied, thereby a quadrangular pyramid in which the (111) plane has an inclination angle of about 54 degrees to the (100) plane is formed. According to such a method, a mold having a pyramidal irregularity structure is obtained as the mold 3. This makes it possible to form an inverse-pyramidal irregularity structure in the underlying layer by nano-imprinting.

Figure 2B:
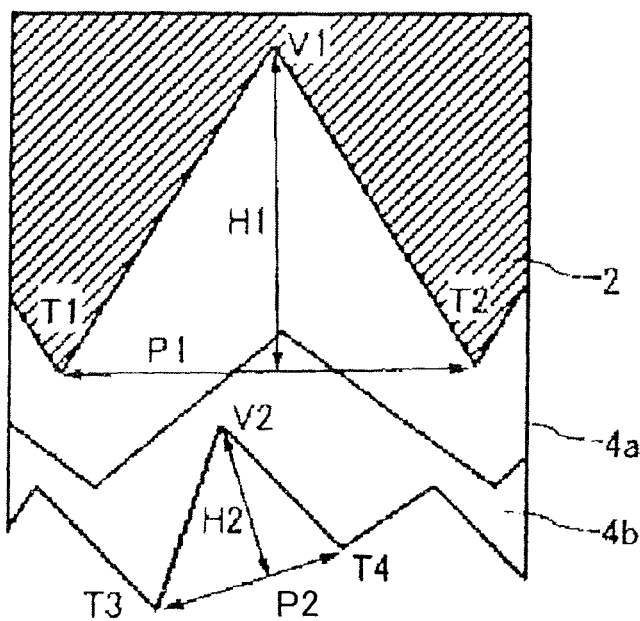
FIG. 2B is a view referred to in order to describe the top-bottom distance of the irregularity structure and the distance between tops of projections of the substrate with transparent conductive film.

About the size of the irregularity of the underlying layer texture, the top-bottom distance H1 of the irregularity structure, which is illustrated in FIG. 2B, is preferably from 100 to 1000 nm. H1 is more preferably 400 nm or more, and 800 nm or less. The distance P1 between tops of the projections is preferably from 200 to 2000 nm. P1 is more preferably 400 nm or more, and 1000 nm or less. When the top-bottom distance H1 is in this range, reflection on the interface between the substrate and the transparent conductive film is decreased, and further incident light which has wavelengths in the range of main wavelengths of the sunlight, in particular, long wavelengths of 700 nm or more, is effectively scattered. Moreover, when the distance P1 between the tops is in the above-mentioned range, a light scattering effect is enhanced and further the generation of defects is restrained in the transparent conductive film deposited on the underlying layer.

Figure 5A:
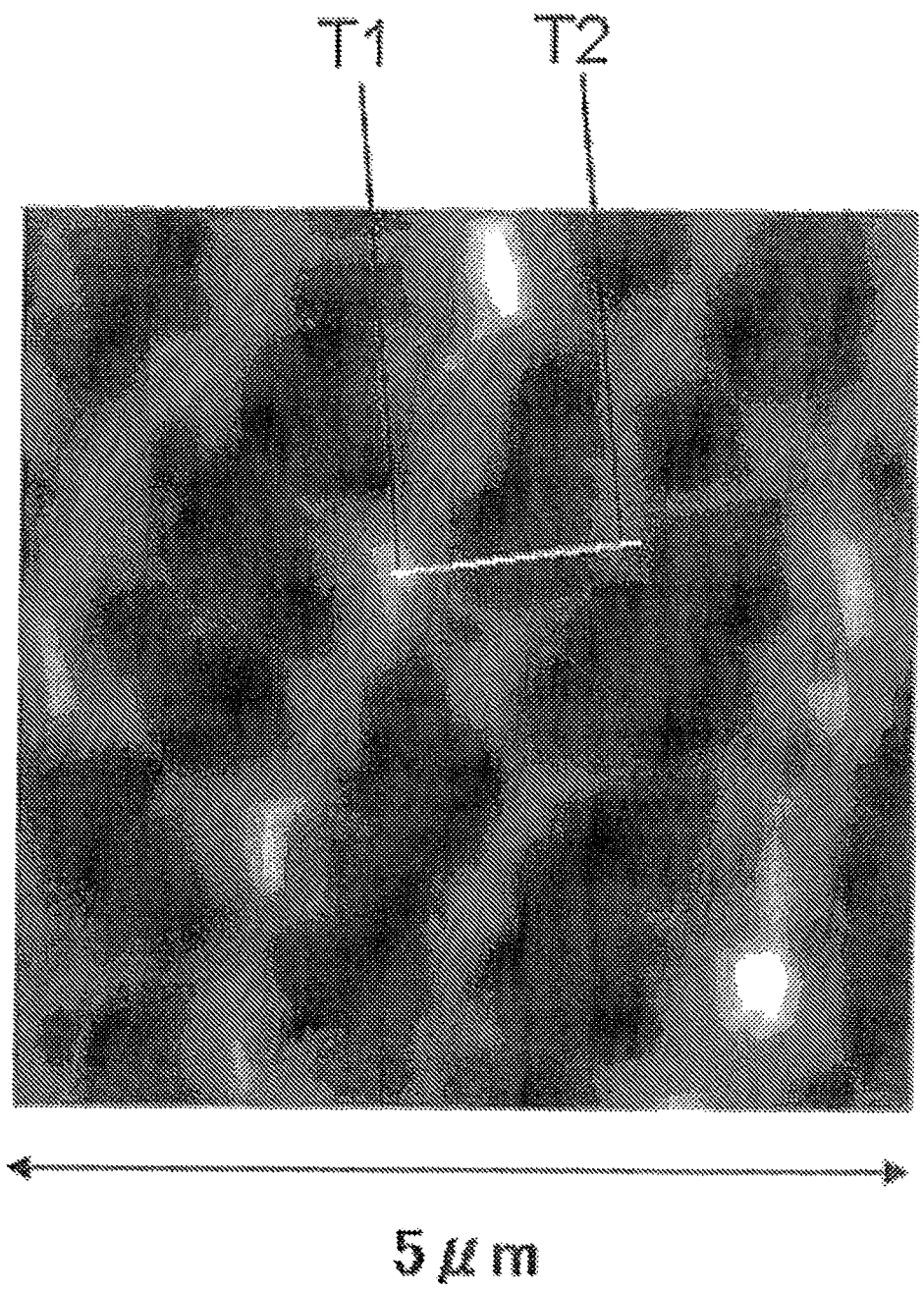
FIG. 5A is a photograph showing an AFM image of a surface irregularity structure of an underlying layer in Example 1.
Figure 5B:
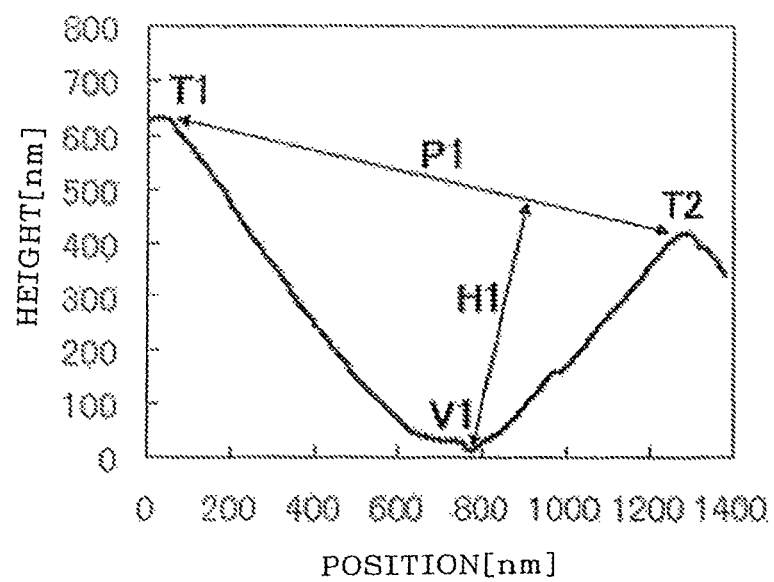
FIG. 5B is a view illustrating a sectional shape along line T1-T2 in FIG. 5A.

These values can be specified by use of, for example, atomic force microscopy (AFM). Specifically, AFM is used to scan the surface of the underlying layer in an area of about 5 μm×5 μm, to measure the shape of the surface. Thereafter, as shown in FIG. 5B, from the measured area, a top T1 of one of the projections of the irregularity structure is selected at random as well as a top T2 of one of the projections adjacent thereto. The valley between the tops T1 and T2 is referred to as the valley V1. On the basis of the distance between the straight line T1-T2 and the V1, the top-bottom distance H1 is calculated. When the size of the irregularity has a distribution, it is advisable to perform the following: any adjacent two of the tops of the underlying layer are selected, and then the top-bottom distance is calculated therefrom as described above; this is repeated 20 times; and the average of the results is defined as the height H1 of the irregularity structure.

The distance P1 between tops of the projections of the underlying layer is obtained from the distance between the T1 and the T2. When the size of the irregularity has a distribution, it is advisable to perform the following: in the same manner as used to calculate out the top-bottom distance H1, a measurement is made about the distance between tops of any adjacent two of the projections; this is repeated 20 times; and then the average of the results is defined as the distance P1 between tops of the projections.

The top-bottom distance H1 of the irregularity structure and the distance P1 between tops of the projections may be measured by use of a transmission electron microscope (TEM) about a cross section of the film. Specifically, these may be obtained by bending the substrate to be broken, and using a transmission electron microscope (TEM) to observe the shape of a cross section of the film over the range of a cross section length of 3.5 μm.

When the top-bottom distance H1 of the irregularity structure of the underlying layer and the distance P1 between tops of the projections are each in the above-mentioned range, incident light having wavelengths in the range of main wavelengths of the sunlight, in particular, long wavelengths of 700 nm or more, is effectively scattered and interfacial reflection is decreased. Thus, in a multi-junction type photoelectric conversion device, the underlying layer having an irregularity structure with the above mentioned H1 and P1 largely contributes to an increase in photoelectric current in its bottom cell.

A transparent conductive film 4 is deposited onto the underlying layer 2. As illustrated in FIG. 2A, the transparent conductive film 4 has at least a first transparent electrode layer 4a deposited on the underlying layer 2, and a second transparent electrode layer 4b that forms the outermost surface of the transparent conductive film 4. The first transparent electrode layer 4a is deposited to cover the entire surface of the underlying layer 2, and the second transparent electrode layer 4b is deposited to cover the entire surface of the transparent electrode layer (the first transparent electrode layer 4a in FIG. 2A) just below the layer 4b.

When the transparent conductive film 4 is made of two or more transparent electrode layers in such a way, the profile of the irregularity structure of the underlying layer is reflected on the outermost surface of the transparent conductive film and comparatively finer irregularities are generated on the surface. This makes it possible to increase the scattering of not only incident rays having a long wavelength range but also incident rays having a shorter wavelength range.

As the first transparent electrode layer 4a, a thin film of a metal oxide, such as tin oxide, zinc oxide, ITO or indium-titanium composite oxide, is deposited onto the underlying layer 2 by CVD, sputtering, vapor deposition or some other method. As the second transparent electrode layer 4b, zinc oxide is deposited by CVD to constitute the outermost surface of the transparent conductive film 4. Between the first and second transparent electrode layers 4a and 4b, a different transparent electrode layer may be deposited. From the viewpoint of the simplification of the producing process, it is preferred that the transparent conductive film 4 is composed of two layers that are the first and second transparent electrode layers 4a and 4b.

As described above, as the second transparent electrode layer 4b, which forms the outermost layer of the transparent conductive film, zinc oxide is deposited by CVD, thereby forming a structure of fine irregularities in the surface of the transparent conductive film 4 even when the film thickness of the transparent conductive film is small. For this reason, a transparent conductive film is obtained which is high in the effect of scattering light rays having a short wavelength range on the basis of the fine-irregularity structure while absorption loss of incident light is reduced by the transparent conductive film.

Examples of the CVD include thermal CVD, and low-pressure CVD (LP-CVD). The transparent electrode layer of zinc oxide is preferably deposited by low-pressure CVD. The term "low-pressure CVD" means any CVD method using a reactive gas having a lower pressure than the atmospheric pressure. The term "CVD" usually means "thermal CVD" except cases where an energy source is clearly specified as in "plasma enhanced CVD" or "light CVD". The term "LP-CVD" has the same meaning as the "low-pressure thermal CVD method". Furthermore, the low-pressure thermal CVD includes, in the category thereof, metal-organic CVD under reduced pressure (abbreviated to MO-CVD).

The thickness of the first transparent electrode layer 4a is preferably 100 nm or more, more preferably 200 nm or more. Moreover, the thickness of the first transparent electrode layer 4a is preferably 2000 nm or less, more preferably 1800 nm or less. When the thickness of the first transparent electrode layer is in the range, the sheet resistance of the transparent conductive film can be set to an appropriate value and further the roughness of the underlying layer is relieved into an appropriate degree. Thus, the generation of defects in a semiconductor layer, such as a silicon layer, deposited on the transparent conductive film is reduced.

The thickness of the first transparent electrode layer 4a may be appropriately set to make the sheet resistance into an appropriate value. An optimal thickness of the layer 4a is varied in accordance with the material that forms the first transparent electrode layer, or the deposition method for forming the layer. When a thin film of a metal oxide, such as tin oxide, zinc oxide, ITO or indium-titanium composite oxide, or the like is deposited as the first transparent electrode layer by a sputtering method, the thickness of the first transparent electrode layer is more preferably 100 nm or more, and even more preferably 200 nm or more. Moreover, the thickness of the first transparent electrode layer is more preferably 600 nm or less, and even more preferably 500 nm or less.

When a zinc oxide as the first transparent electrode layer is deposited by low-pressure CVD, the thickness of the first transparent electrode layer is more preferably 400 nm or more, and even more preferably 600 nm or more, and in particular preferably 800 nm or more. Moreover, the thickness of the first transparent electrode layer is more preferably 2000 nm or less, and even more preferably 1800 nm or less, and in particular preferably 1600 nm or less.

The thickness of the second transparent electrode layer 4b is preferably 200 nm or more, and more preferably 300 nm or more, and even more preferably 400 nm or more. The thickness of the second transparent electrode layer 4b is preferably 800 nm or less, and more preferably 700 nm or less, and even more preferably 600 nm or less.

When the thickness of the second transparent electrode layer 4b is set into the range, fine irregularities with top-bottom distances smaller than those of the irregular structures of the underlying layer 2 (the top-bottom distance is, for example, from 20 to 400 nm) are generated, so that scattering of incident light having a short wavelength range can be increased. If the thickness of the second electrode layer 4b is excessively small, such fine unevens irregularities are not easily generated. If the thickness of the second electrode layer 4b is excessively large, the top-bottom distance of the irregularities formed in the surface of the transparent conductive film becomes large. As a result, defects may be generated in a semiconductor layer, such as a silicon layer, that are deposited on the transparent conductive film. As a result, photoelectric conversion properties (in particular, the open circuit voltage) of the thin film photoelectric conversion device may be reduced.

The top-bottom distance H2 of the irregular structure of the second transparent electrode layer 4b may be adjusted in accordance with, for example, the film thickness of the second transparent electrode layer 4b. When the thickness of the second transparent electrode layer 4b is smaller, the top-bottom distance H2 tends to become small. When the thickness of the second transparent electrode layer is made large, the top-bottom distance H2 becomes large so that the fine irregularities in the surface of the transparent conductive film 4 tends to turn into a steeper shape.

Specific examples of the method for forming the transparent conductive film 4 is the following: deposit the first transparent electrode layer 4a by low-pressure CVD, interrupting deposition temporarily, and subsequently deposit the second transparent electrode layer 4b by low-pressure CVD; or deposit the first transparent electrode layer 4a by sputtering, and subsequently deposit the second transparent electrode layer 4b by low-pressure CVD.

Hereinafter, a detailed description will be made about the method of depositing the first transparent electrode layer 4a by low-pressure CVD, interrupting deposition temporarily, and subsequently depositing the second transparent electrode layer 4b by low-pressure CVD.

Deposition conditions for forming the transparent conductive film by the low-pressure CVD are not particularly limited. For example, it is preferred that raw material gases, including organic zinc, oxidizer, and doping gas, and diluting gases are provided under conditions wherein the substrate temperature is from 120 to 180° C. and the pressure is from 5 to 1000 Pa. The substrate temperature is more preferably from 140 to 160° C., and the pressure is more preferably from 5 to 100 Pa, further preferably from 5 to 20 Pa. By performing the deposition under such conditions, a high-quality film is easily formed, in which the number of grain boundaries is small, and strains in the crystal are relieved.

The organic zinc may be diethyl zinc (DEZ), dimethyl zinc or the like. DEZ is preferred since the material is reactive with the oxidizer, and the raw material is easily available. The oxidizer may be water, oxygen, carbon dioxide, carbon monoxide, dinitrogen oxide, nitrogen dioxide, sulfur dioxide, dinitrogen pentaoxide, an alcohol (R(OH)), a ketone (R(CO)R'), an ether (ROR'), an aldehyde (R(COH)), an amide ((RCO)$_x$(NH$_{3-x}$) wherein x=1, 2 or 3), a sulfoxide (R(SO)R') wherein R and R' are each an alkyl group), or the like. The oxidizer is preferably water since water is reactive with the organic zinc and is easily handled.

The diluting gas may be a rare gas (He, Ar, Xe, Kr, or Rn), or nitrogen, hydrogen, or the like. The diluting gas is preferably hydrogen, which is high in thermal conductivity and excellent in thermal uniformity inside the substrate. The doping gas may be diborane ($B_2H_6$), an alkylaluminum, an alkylgallium, or some other. The gas is desirably diborane, which is excellent in decomposition efficiency. When water is used as the oxidizer, it is preferred to vaporize water by thermal evaporation, bubbling, spraying or some other method, and then supply the vaporized water since water is a liquid at normal temperature under normal pressure.

In an embodiment, a CVD device for depositing the transparent electrode layers has a substrate-charging chamber and a deposition chamber. The substrate-charging chamber is placed for the following: the substrate on which the films are to be deposited is put therein and removed therefrom; pressure-reduction is attained; and further the substrate on which the films have been deposited in the deposition chamber is returned again to this substrate-charging chamber so as to be allowed to rest. The pressure in the substrate-charging chamber can be varied from the atmospheric pressure to several pascals. In the deposition chamber, the atmosphere therein is kept a reduced-pressure atmosphere. The substrate is transported from the substrate-charging chamber into the deposition chamber, and raw materials gasses are supplied thereinto so as to deposit the films. Additionally, after the deposition of the films, the gas is discharged to make the inside into a vacuum (this operation is referred to as "evacuation" hereinafter). In this case, the pressure in the chamber (hereinafter referred to as the "vacuum degree") may be set to $3\times10^{-3}$ Pa or less. In the invention, it is preferred to make the inside of the deposition chamber into a condition close to a vacuum at times except the time of supplying the reactive gas in the deposition.

After the first transparent electrode layer 4a is deposited, deposition is temporarily interrupted. Again, a deposition is started to deposit the second transparent electrode layer 4b. By interrupting deposition temporarily in this way, a texture in which fine projections each having a substantially triangular cross section that are continuous with each other is formed in the surface of the second transparent electrode layer 4b, as illustrated in an enlarged photograph of FIG. 11B.

The inventors have attempted to use low-pressure CVD to deposit a single zinc oxide layer, without interrupting deposition in midstream, onto an underlying layer having irregularities formed by a nano-imprinting method as described above. However, even when a zinc oxide layer having a thickness of about 1000 to 2000 nm, which is necessary for causing this layer to have an electroconductivity suitable for a transparent conductive film, was deposited, the obtained transparent conductive film had a surface that the profile of the irregularity of the underlying layer is slightly relieved, and a fine-irregular structure was not obtained.

Figure 11A:
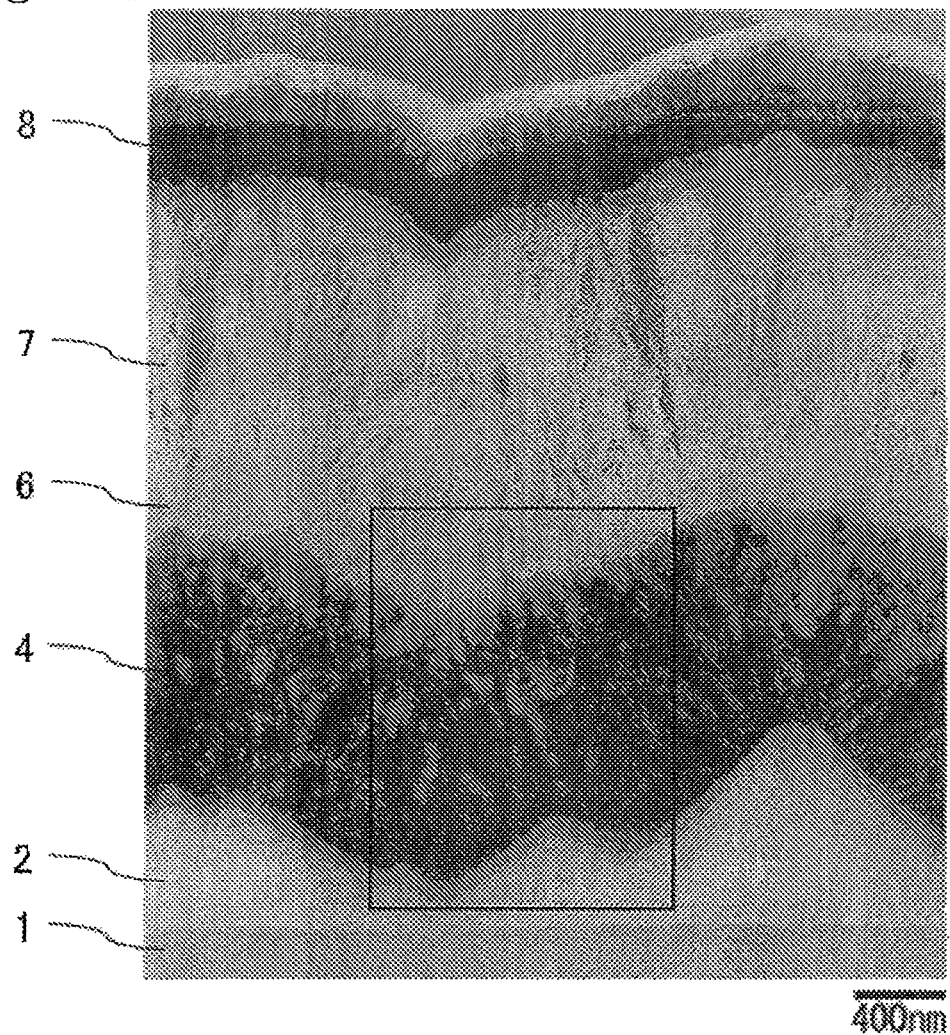
FIG. 11A is a sectional-TEM-observed photograph of a double-junction type thin film silicon solar cell (thin film photoelectric conversion device) of Example 2.
Figure 11B:
FIG. 11B is an enlarged view of a frame area in FIG. 11A.

When a thicker zinc oxide layer was formed by a single continuous deposition, irregularities having a large top-bottom distance were formed in the surface of the transparent conductive film due to crystalline growth of zinc oxide, but fine projections as shown in the enlarged photograph of FIG. 11B were not obtained. In a thin film photoelectric conversion device in which a photoelectric conversion unit and a back electrode layer are deposited on the transparent conductive film having large size irregularities as described above, no short circuit current density improvement is obtained and further a decrease is caused in open circuit voltage. The decrease in the open circuit voltage would be caused by defects in the silicon layer, which is generated from the recesses in the surface of transparent conductive film surface as start points due to large top-bottom distance thereof.

In contrast, by interrupting low-pressure CVD deposition temporarily as in the invention, fine irregularities are formed. The reason for this is unclear; however, the reason could be as follows: by the interruption of deposition, the growth of crystalline is temporarily stopped in the first transparent electrode layer 4a; and when the second transparent electrode layer 4b is deposited thereonto, valleys or side surfaces of the texture of the surface of the first transparent electrode layer 4a act as new crystal nuclei. In deposition of the second transparent electrode layer, it is presumed that from these new crystal nuclei, new irregular structures grow, whereby the number of projections increases and further the steep form thereof is relieved so that fine projections having an appropriate top-bottom distance are formed.

When tin oxide layers, as the transparent electrode layers 4a and 4b, are deposited by CVD, such fine irregularities are not formed. It therefore appears that the generation of a fine-irregular structure is a phenomenon peculiar to a case where zinc oxide is deposited by CVD. The reason why the fine-irregular structure is generated when zinc oxide is deposited is unclear; however, one of the reason for this could relate to a unique crystalline growth of zinc oxide.

The following will describe a method for temporarily interrupting deposition after the deposition of the first transparent electrode layer 4a. The method for interrupting deposition may be a method under a reduced-pressure atmosphere or a method under the atmospheric pressure.

The "method under a reduced-pressure atmosphere" is a method in which after the first transparent electrode layer 4a is continuously deposited under a reduced-pressure atmosphere in the deposition chamber, deposition is stopped by evacuation. The wording "continuously formed under a reduced-pressure atmosphere" means the following: while the pressure in the chamber is kept in a reduced-pressure state, the transparent electrode layer is deposited without taking out the substrate into an environment under atmospheric pressure. In order to stop deposition in this method, it is preferred that the substrate is transported from the deposition chamber to the substrate-charging chamber or some other space, and then substrate is allowed to rest. In order to stop deposition, the vacuum degree in the deposition chamber is preferred to be set to $3\times10^{-3}$ Pa or less. In this case the substrate temperature is preferred to be set to 100° C. or lower. By setting the vacuum degree into the range, deposition can be stopped. By setting the substrate temperature into the range, deposition can be stopped almost completely.

The "method under the atmospheric pressure" denotes a method in which after the deposition of a film in the deposition chamber, the substrate is taken out into an environment under atmospheric pressure and then the substrate is again put into the deposition chamber so as to deposit the next layer in a reduced-pressure atmosphere. By taking out the substrate once into an environment under atmospheric pressure in such a way, deposition can be stopped. At this time, it is preferred that the substrate is taken out from the deposition chamber through the substrate-charging chamber to the environment under atmospheric pressure.

Of these methods, the "method under a reduced-pressure atmosphere" makes it possible to interrupt deposition, without taking out the substrate from the deposition apparatus, only by adjusting gas-supply, gas-discharge, chamber temperature, or the like. Moreover, each of the transparent electrode layers can be deposited only by CVD; thus, from the viewpoint of costs, productivity, and others, this method can be more preferably employed than any methods in which different deposition methods, such as CVD and sputtering, are used together with each other.

The following will describe a method of depositing the first transparent electrode layer 4a by sputtering, and then depositing the second transparent electrode layer 4b by low-pressure CVD.

The sputtering for depositing the first transparent electrode layer 4a may be a previously known method. The material which constitutes the first electrode layer 4a is preferably a metal oxide such as tin oxide, zinc oxide, ITO, or indium-titanium composite oxide. In particular, indium-titanium composite oxide has high transmittance in the range of infrared wavelengths; thus, in a multi-junction type photoelectric conversion device wherein indium-titanium composite oxide is used for a transparent conductive film, photoelectric current increases in its bottom cell and the increase contributes to an improvement in photoelectric conversion properties.

As a target for the sputtering, a metal oxide as described above is used. The metal oxide target may be a target doped appropriately with a conductive metal such as aluminum. A carrier gas, such as argon, hydrogen, oxygen or nitrogen gas, is used and an electric power of about 0.1 to 5 W/cm$^2$ from a power source of DC, RF, VHF, or other mode is supplied to deposit the transparent electrode layer on the substrate.

The substrate on which the first transparent electrode layer 4a is deposited by the sputtering is conveyed to a CVD device, and then the second transparent electrode layer 4b is deposited by low-pressure CVD. The method for depositing the second transparent electrode layer 4b by low-pressure CVD is as described above; thus, details thereof are omitted herein.

Figure 10A:
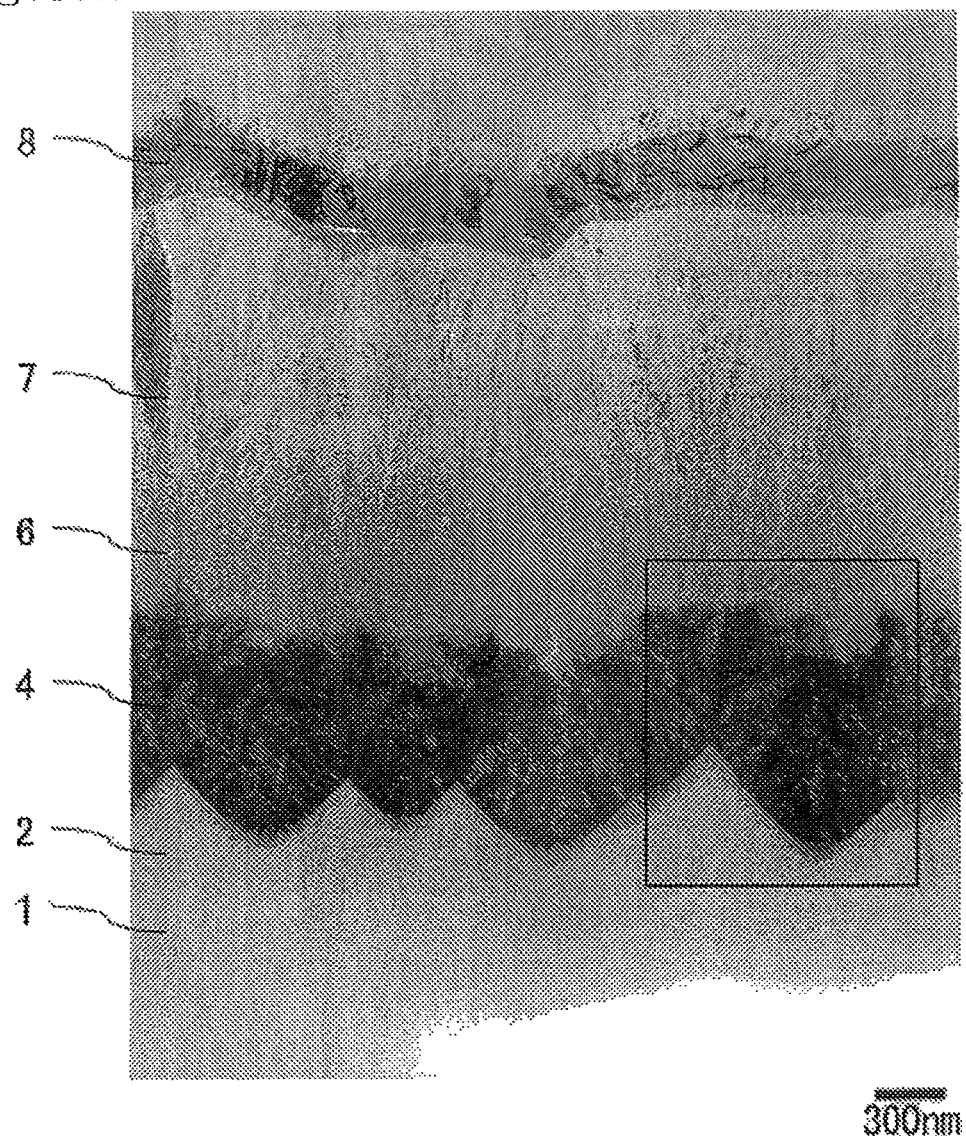
FIG. 10A is a sectional-TEM-observed photograph of a double-junction type thin film silicon solar cell (thin film photoelectric conversion device) of Example 1.
Figure 10B:
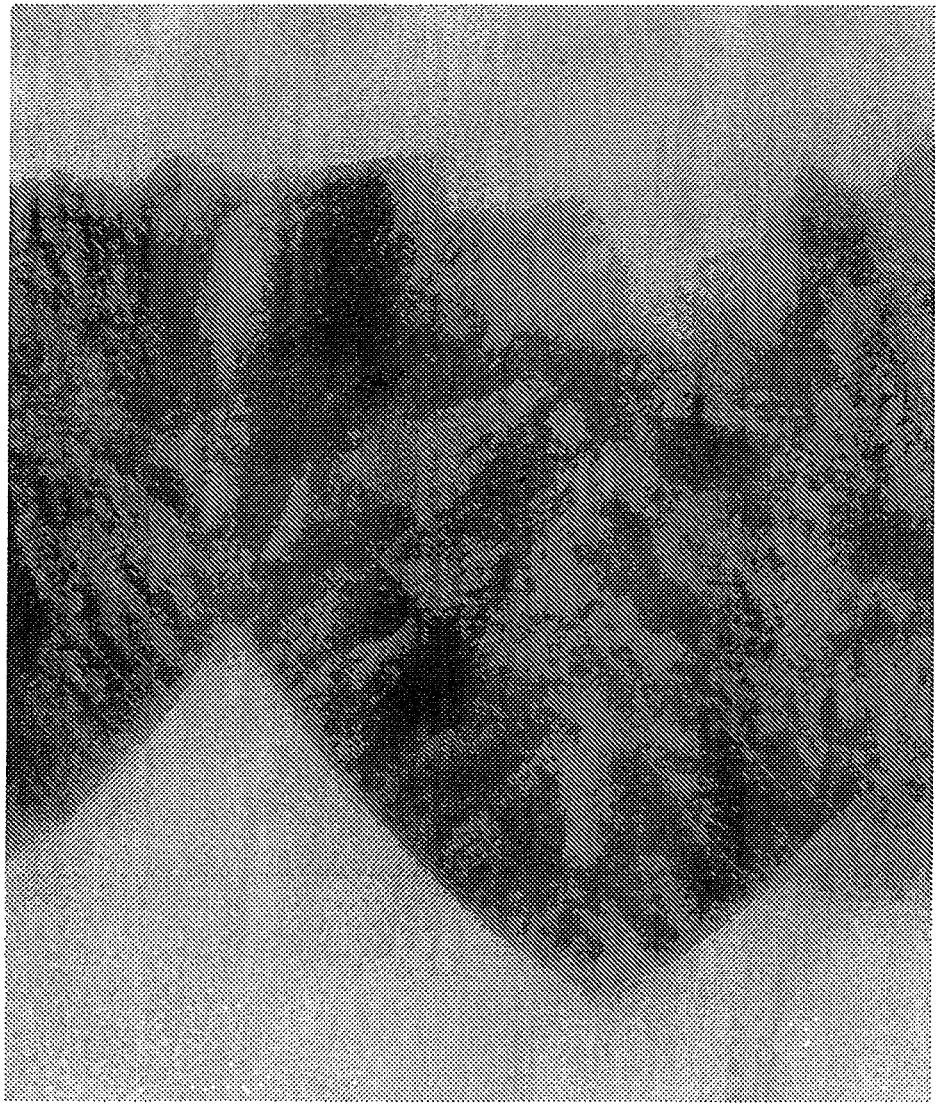
FIG. 10B is an enlarged view of a frame area in FIG. 10A.

When the second transparent electrode layer 4b is deposited by low-pressure CVD after the sputtering deposition of the first transparent electrode layer 4a, a texture in which fine projections each having a substantially triangular cross section are continuous to each other, as shown in an enlarged photograph in FIG. 10B, is formed.

The inventors have attempted to use only sputtering to form a transparent conductive film of zinc oxide onto a substrate having an underlying layer 2 having irregularities formed by a nano-imprinting method as described above. However, when a zinc oxide layer having a thickness of about 300 nm, which is a thickness necessary for a transparent conductive film, is formed, the resultant transparent conductive film has a shape that the profile of the irregularities of the underling layer is relieved and fine irregularities were not formed. In a thin film photoelectric conversion device in which a photoelectric conversion unit and aback electrode are deposited on a transparent conductive film deposited only by sputtering as described above, a rise in short circuit density is not caused. The reason therefor would be as follows: as the transparent conductive film by the sputtering is increased in film thickness, the profile of the irregularities of the underlying layer is further relieved; thus, it is difficult to obtain a light scattering effect in the interface between the transparent conductive film and the photoelectric conversion unit.

In the invention, in contrast, a thickness direction portion of the transparent conductive film, as the first transparent electrode layer 4a, is deposited using sputtering. In this case, the following situation appears to be caused: the surface of the first transparent electrode layer 4a has a texture structure in which the profile of the irregular structure of the underlying layer is kept in an appropriate degree; and when the second transparent electrode layer 4b is deposited by low-pressure CVD, valleys or side surfaces of the texture of the first transparent electrode layer 4a surface act as crystal nuclei. In the deposition of the second transparent electrode layer, it is presumed that from these crystal nuclei, a new irregular structure grows so that the number of projections increases and further fine projections having an appropriate top-bottom distance are formed.

On the other hand, when a tin oxide layer is deposited as the second transparent electrode layer 4b by CVD, such fine projections are not formed. It is therefore considered that, even when the first transparent electrode layer 4a is deposited by sputtering, the phenomenon that the fine-irregular structure is generated in the surface of the second transparent electrode layer 4b is a phenomenon peculiar to the case of depositing zinc oxide by CVD.

About the size of the irregular structure in the transparent electrode layer 4 surface, it is preferred that the top-bottom distance H2 of the irregular structure illustrated in FIG. 2B is from 20 to 400 nm, and the distance P2 between tops of the projections is from 50 to 1000 nm. Similarly to H1 and P1 in the underlying layer 2, these values may be measured by use of an atomic force microscope (AFM) or a transmission electron microscope (TEM).

Figure 6A:
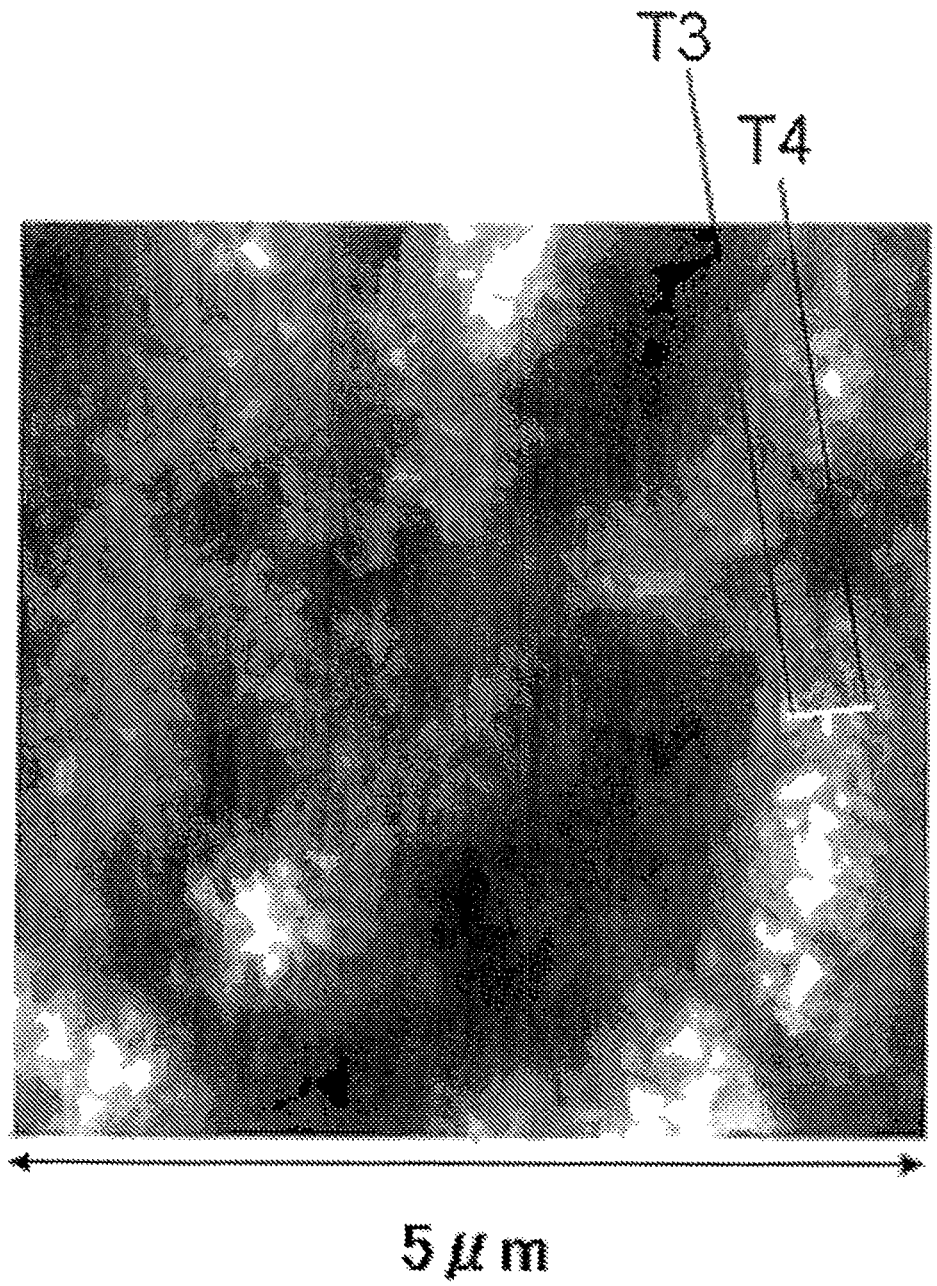
FIG. 6A is a photograph showing an AFM image of a surface irregularity structure of a transparent conductive film in Example 1.
Figure 6B:
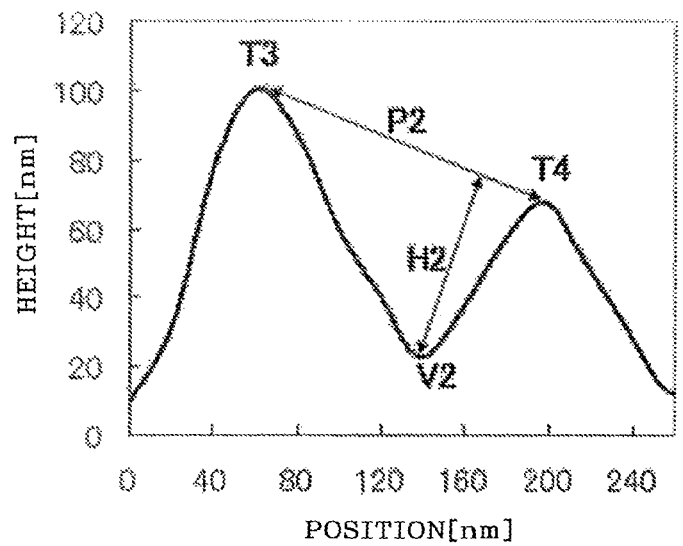
FIG. 6B is a view illustrating a sectional shape along line T3-T4 in FIG. 6A.
Figure 7A:
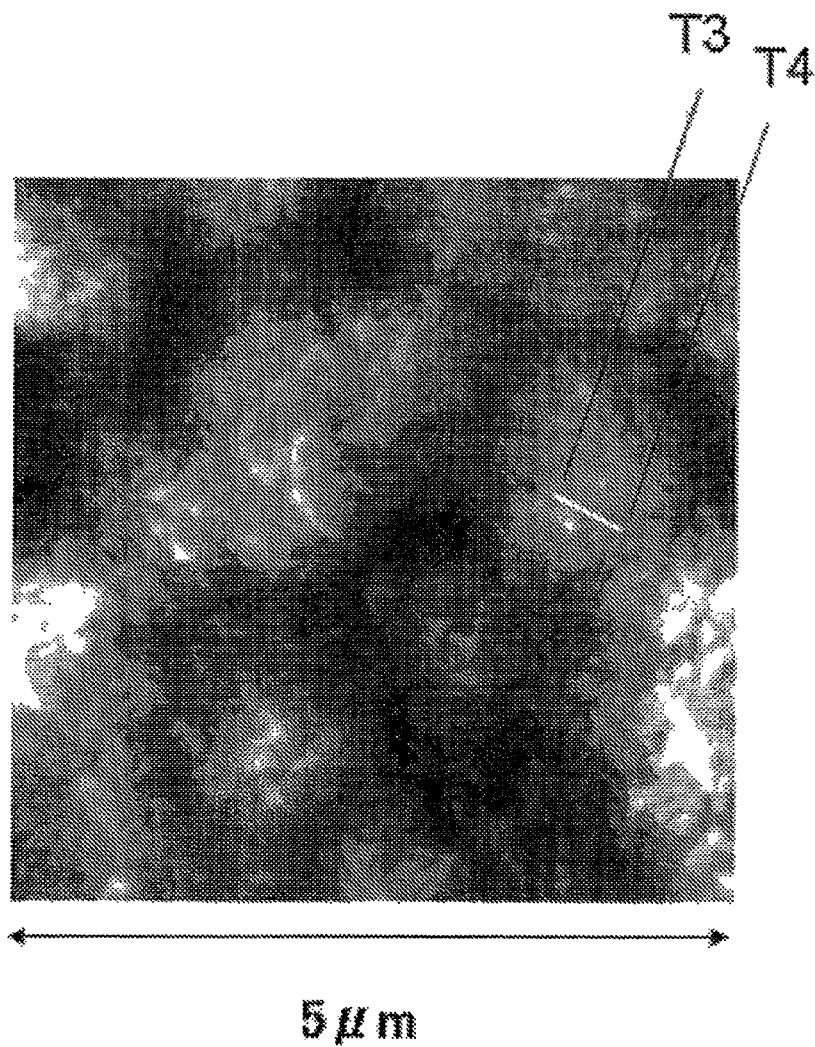
FIG. 7A is a photograph showing an AFM image of a surface irregularity structure of a transparent conductive film in Example 2.
Figure 7B:
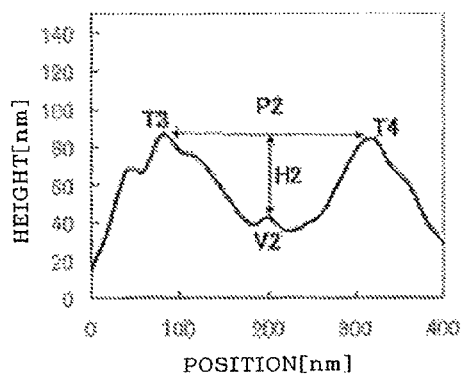
FIG. 7B is a view illustrating a sectional shape along line T3-T4 in FIG. 7A.

When H2 and P2 are obtained through an AFM, as illustrated in FIGS. 6B and 7B, a top T3 of one of the projections of the irregular structure is selected at random from a measured area, as well as a top T4 of one of the projections adjacent to the top T3. The others may be obtained in the same way as described above about the measurement of H1 and P1.

When the top-bottom distance H2 and the distance P2 between tops of the projections in the irregular structure of the transparent conductive film surface are in the above-mentioned respective ranges, incident light having main wavelengths of the sunlight, in particular, short wavelengths of 700 nm or less are effectively scattered. Furthermore, interfacial reflection is decreased. Thus, in a multi-junction type photoelectric conversion device, the transparent conductive film having an irregular surface with the above mentioned H2 and P2 largely contributes to increase in photoelectric current in its top cell.

Specifically, the top-bottom distance H2 is smaller than the top-bottom distance H1. For this reason, difference is generated between the wavelength range of light scattered by the large-size irregularity texture in the underlying layer 2 surface and the wavelength range of light scattered by the small-size irregularity texture in the transparent conductive film 4 surface, so that incident light having a wide-wavelength range can be scattered. When the distance P2 between tops of the projections is smaller than the distance P1, the area of each of the projections of the small size texture becomes small so that the fine irregularities are more densely formed. When P2 and H2 give a predetermined ratio therebetween, the angle of the side surfaces of the projections makes the projections into a shape suitable for an increase in the scattering of incident light and the anti-reflection thereof.

The haze ratio of the transparent conductive film is preferably from about 5 to 80%, more preferably from about 35 to 80%. The sheet resistance is set preferably into the range of 5 to 20 Ω/square. Values of the haze ratio and the sheet resistance can be adjusted into the respective ranges in accordance with the kind of the conductive metal oxide which forms of the transparent conductive film, the deposition method of the film, the adjustment of the thickness of the transparent conductive film, and the like.

As described above, in the substrate with transparent conductive film of the invention, a texture with large size irregularities is formed in the surface of its underlying layer 2, while, in the surface of its transparent conductive film 4, a texture with small size irregularities, which is made of fine irregularities having a top-bottom distance of about 20 to 400 nm, is formed on the profile on which the large size texture of the underlying layer is reflected. By the large size texture of the underlying layer 2 surface and the profile of the transparent conductive film surface on which this texture is reflected, long-wavelength incident light are effectively scattered. By the small size texture of the transparent conductive film surface, shorter-wavelength incident light are effectively scattered. For this reason, when the substrate with transparent conductive film of the invention is used to produce a photoelectric conversion device, there is produced an effect of increasing a short circuit current in the photoelectric conversion device.

Since the texture of the surface of the transparent conductive film 4 is in such a shape that the large size texture of the underlying layer is relieved into an appropriate degree, an improvement is made in surface coverage of a semiconductor layer (typically, a silicon layer) of a photoelectric conversion unit deposited on the transparent conductive film. Thus, the generation of linear-shape defects such as cracks is restrained. For this reason, the substrate with transparent conductive film of the invention restrains a fall in open circuit voltage based on defects of the semiconductor layer while the substrate exhibits the above-mentioned short-circuit-current increasing effect, which is based on the improvement in the light scattering property. Thus, the present invention contributes to an improvement in the conversion efficiency of a photoelectric conversion device.

Since the substrate with transparent conductive film of the invention makes it possible to scatter incident light in a wide wavelength range, the substrate can be favorably used as a substrate of a thin film photoelectric conversion device, in particular, a multi-junction type photoelectric conversion device, in which two or more photoelectric conversion units are stacked. Of such multi-junction type photoelectric conversion devices, in particular, a double-junction type photoelectric conversion device, in which an amorphous silicon photoelectric conversion unit and a crystalline silicon photoelectric conversion unit are stacked in this order onto the substrate with transparent conductive film of the invention, is favorably adopted.

Figure 3:
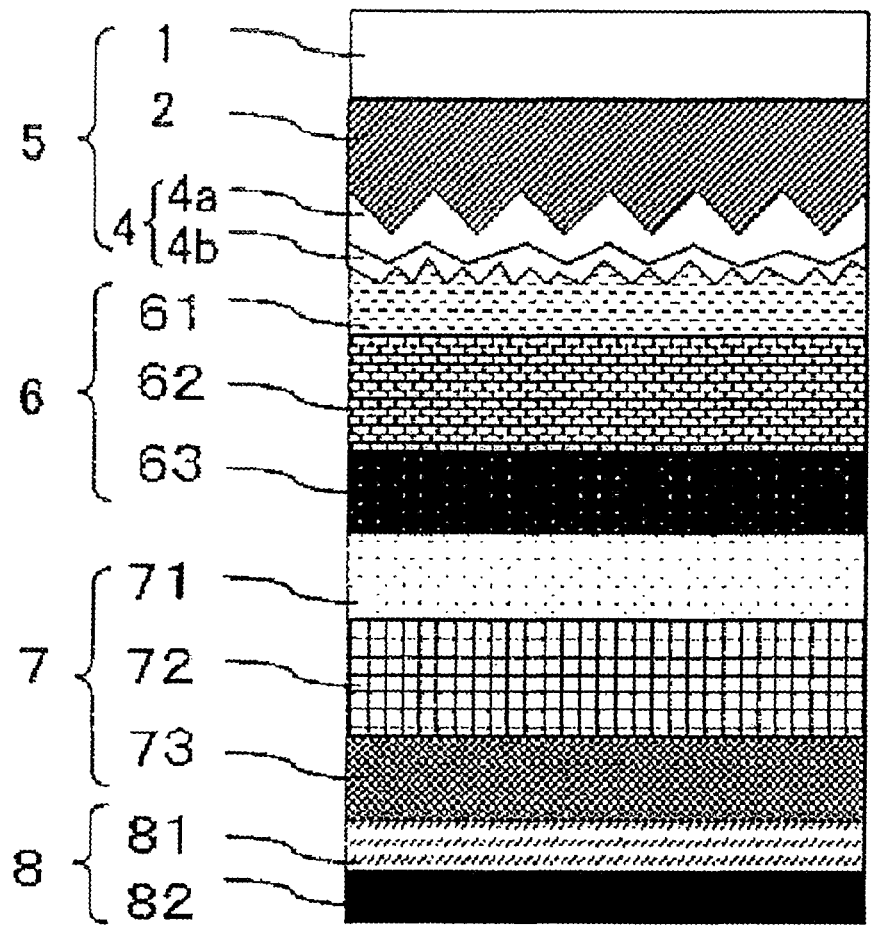
FIG. 3 is a schematic sectional view of a double-junction type thin film silicon solar cell of an embodiment of the invention.

FIG. 3 shows a schematic sectional view of a thin film photoelectric conversion device according to an embodiment of the invention. A double-junction type thin film photoelectric conversion device, in which an amorphous silicon photoelectric conversion unit 6 as a top cell, a crystalline silicon photoelectric conversion unit 7 as a bottom cell, and aback electrode layer 8 stacked in this order on a substrate with transparent conductive film 5, is illustrated in FIG. 3.

Amorphous silicon based material has a sensitivity to light having a wavelength of 360 to 800 nm, and crystalline silicon based material has a sensitivity to light having a wavelength of about 1200 nm or less. Accordingly, when an amorphous silicon based material is selected for a photoelectric conversion layer (i-layer) of the top cell and a crystalline silicon based material is selected for a photoelectric conversion layer (i-layer) of the bottom cell, the sensitivity property of the top cell is improved by light scattering on small size irregularities of the substrate with transparent conductive film, and further the sensitivity property of the bottom cell is improved by light scattering on large size irregularities thereof. Thus, the device obtained is a double-junction type photoelectric conversion device high in short circuit current density.

Examples of the "silicon based" material include not only silicone but also silicon alloy semiconductor materials such as silicon carbide and silicon germanium. The term "crystalline" and the term "microcrystalline" may include crystalline material which partially includes amorphous state substance, as used generally in the technical field of thin film photoelectric conversion devices.

The amorphous silicon photoelectric conversion unit 6 is formed by depositing a p-layer, an i-layer, and an n-layer in this order by, for example, plasma enhanced CVD. An example of the amorphous silicon photoelectric conversion unit 6 is a unit having a structure composed of a p-type amorphous silicon carbide layer 61, an i-type amorphous silicon layer 62 and an n-type microcrystalline silicon layer 63.

The amorphous silicon carbide layer 61 may be deposited by introducing silane, diborane, hydrogen and methane into a chamber. In this case, it is preferred to set the film thickness into the range of 5 to 50 nm. Next, preferably, silane and hydrogen are introduced, as deposition gases, into the chamber, to deposit the i-type amorphous silicon layer 62 into a film thickness of 100 to 500 nm, and further silane, phosphine and hydrogen are introduced, as deposition gases, into the chamber, to deposit the n-type microcrystalline silicon layer 63 into a film thickness of 5 to 50 nm.

Next, the crystalline silicon photoelectric conversion unit 7 is deposited on the amorphous silicon photoelectric conversion unit 6. The crystalline silicon photoelectric conversion unit 7 is also formed by depositing a p-layer, an i-layer and an n-layer in this order by, for example, plasma enhanced CVD. An example of the crystalline silicon photoelectric conversion unit 7 is a unit having a structure composed of a p-type microcrystalline silicon layer 71, an i-type crystalline silicon layer 72 and an n-type microcrystalline silicon layer 73.

The p-type microcrystalline silicon carbide layer 71 may be deposited by introducing silane, diborane, and hydrogen into the chamber. In this case, it is preferred to set the film thickness into the range of 5 to 50 nm. Next, preferably, silane and hydrogen are introduced, as deposition gases, into the chamber, to deposit the i-type crystalline silicon layer 72 into a film thickness of 500 to 3500 nm, and further silane, phosphine and hydrogen are introduced, as deposition gases, into the chamber, to deposit the n-type microcrystalline silicon layer 73 into a film thickness of 5 to 50 nm.

The back electrode layer 8 is deposited onto the crystalline silicon photoelectric conversion unit 7. The back electrode layer 8 is preferably made into a double layer structure composed of a zinc oxide layer 81 and an Ag layer 82. The zinc oxide layer 81 is deposited by sputtering or CVD. The layer is preferably deposited by CVD since an electrical damage to the silicon layers can be decreased. The Ag layer 82 may be deposited by sputtering, vapor deposition, or some other method.

In order to improve the conversion efficiency of the tandem type photoelectric conversion device, an intermediate transmitting/reflecting layer (not illustrated) may be deposited between the top cell 6 and the bottom cell 7. The intermediate transmitting/reflecting layer may be designed in such a manner that light of short wavelengths are reflected thereon while light of longer wavelengths are transmitted therethrough. The thin film photoelectric conversion units 6 and 7 each make it possible to attain a more effective photoelectric conversion.

The material of the intermediate transmitting/reflecting layer may be a conductive metal oxide such as zinc oxide, tin oxide, and ITO, or may be a silicon based hybrid material containing microcrystalline silicon and silicon oxide, which may be deposited by plasma enhanced CVD in the same way as the amorphous silicon layers or the crystalline silicon layers.

Figure 4:
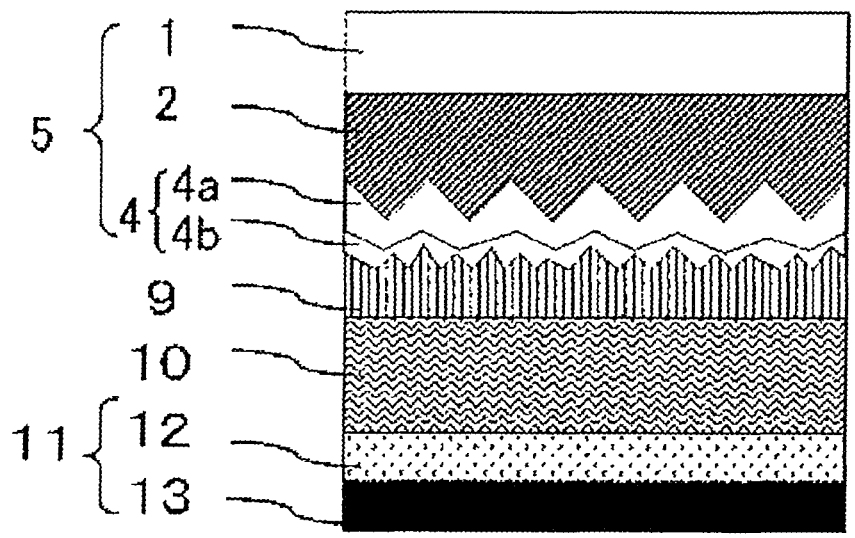
FIG. 4 is a schematic sectional view of an organic EL luminescent element (luminescent element) of an embodiment of the invention.

The following will describe an example of a method for forming an organic electroluminescent element which is an embodiment of the invention. FIG. 4 is a sectional view of the organic EL element, which is the embodiment of the invention.

First, a hole transporting layer 9 is deposited onto a substrate with transparent conductive film 5. The hole transporting layer is not particularly limited as far as the layer is a layer having any one of a function of injecting holes from a transparent conductive film 4, and a function of transporting holes therefrom. The material thereof may be, for example, a carbazole derivative, a triazole derivative, an oxazole derivative, an oxadiazole derivative, or an imidazole derivative, and may be a polymeric compound having the same function.

A luminescent layer 10 is deposited onto the hole transporting layer 9. For the luminescent layer, a fluorescence emitting compound or a phosphorescence emitting compound is used. The fluorescence emitting compound is not particularly limited, and may be a metal complex of an 8-quinolinol derivative or some other. The phosphorescence emitting compound is not particularly limited, and is preferably an ortho-metallized metal complex or a porphyrin metal complex.

A cathode layer 11 is deposited onto the luminescent layer 10. The cathode layer 11 is desirably composed of an alkali metal layer 12 made of an alkali metal such as Li, Na, K or Cs, or an alkaline earth metal such as Mg or Ca, and a metal layer 13 made of gold, silver, lead, aluminum or some other metal. These may each be used in the form of a single layer or a stacked layer. The deposition method for forming the cathode may be a physical method such as vacuum evaporation, sputtering or ion plating, a chemical method such as CVD, or some other method. The cathode may be formed by in accordance with a method selected appropriately, considering adaptability to the raw material (s).

EXAMPLES

As specific examples of embodiment as described above, some working examples will be described together with comparative examples hereinafter.

Example 1

A double-junction type thin film photoelectric conversion device as illustrated in FIG. 3 was produced as Example 1.

First, an $SiO_2$ layer was deposited, as an underlying layer 2, onto a glass substrate 1 having 0.7 mm thick and 125 mm square, by a sol-gel process. A coating solution used therefor was a $SiO_2$ sol-gel solution (trade name: 512B, manufactured by Honeywell International, Inc.), which is used as an SOG material. A coating method used therefor was spin coating and the layer was formed into a film thickness of 1000 nm.

Next, the whole of the substrate on which the underlying layer 2 was formed was pre-baked on a hot plate at 60° C. for 20 minutes to semi-cure the underlying layer. Subsequently, the substrate was transported into an imprinting device to push, against the underlying-layer-2-formed substrate, a mold 3 in which an irregular structure of was formed in a surface of a monocrystalline silicon substrate. The irregularities were in the shape of pyramids each having each bottom side of about 600 nm length. According to the nano-imprinting method, an inverse-pyramidal-irregular structure was formed in the underlying layer. The irregular structure of the mold 3 was formed by degreasing and washing a monocrystalline silicon substrate with acetone and ethanol under the application of ultrasonic irradiation thereto, and then immersing the substrate in an aqueous mixed solution of potassium hydroxide and isopropyl alcohol, thereby etching the substrate for a predetermined period.

Subsequently, the substrate, wherein the irregular structure was formed in the underlying layer, was fired at 400° C. in atmospheric air for 1 hour. This substrate was folded to be broken, and an AFM was used to observe the surface shape in an area of 5 μm×5 μm. An AFM image of the surface of the underlying layer 2 is shown in FIG. 5A. The irregular structures of this underlying layer were adjacent to each other. The top-bottom distance H1 was 420 nm, and the distance P1 between tops of the projections was 1200 nm. A transmission electron microscope (TEM) was used to observe the sectional shape of the folded and broken substrate over a cross section length of 3.5 μm. The irregular structures of this underlying layer were adjacent to each other. The top-bottom distance H1 thereof was from 200 to 600 nm, and the distance P1 between tops of the projections was from 300 to 1200 nm.

Light was radiated into the substrate, on which the underlying layer was formed, from the substrate side on which no irregular structure was formed, and the transmittance of the substrate was measured with a spectrophotometer. The substrate exhibited a transmittance of 85% or more in the range of wavelengths of 400 to 1200 nm.

Zinc oxide doped with Al was deposited by sputtering, as a transparent electrode layer 4a, into a thickness of 300 nm onto the irregular-structure-formed side of the substrate, in which the underlying layer was formed.

Next, a second transparent electrode layer 4b was deposited into a thickness of 400 nm by low-pressure CVD. In this way, a transparent conductive film 4 was deposited. Conditions for depositing the transparent electrode layer 4b by the low-pressure CVD were as follows: the glass substrate was first transported into a deposition chamber, and the substrate temperature was controlled to 150° C.

Thereafter, hydrogen at 1000 sccm, diborane diluted with 5000 ppm of hydrogen at 500 sccm, water at 100 sccm, and diethyl zinc at 50 sccm were introduced thereinto. The pressure in the chamber was set to 10 Pa at this time.

AFM was used to observe the surface shape of the transparent conductive film 4, wherein the second transparent electrode layer 4b was deposited on the first transparent electrode layer 4a, in an area of 5 μm×5 μm. An AFM image of the surface of the transparent conductive film 4 is shown in FIG. 6A. The top-bottom distance H2 of the irregular structure of this transparent conductive film was 90 nm, and the distance P2 between tops of the projections was 150 nm. The sheet resistance of this transparent conductive film was 12 Ω/square.

Figure 8:
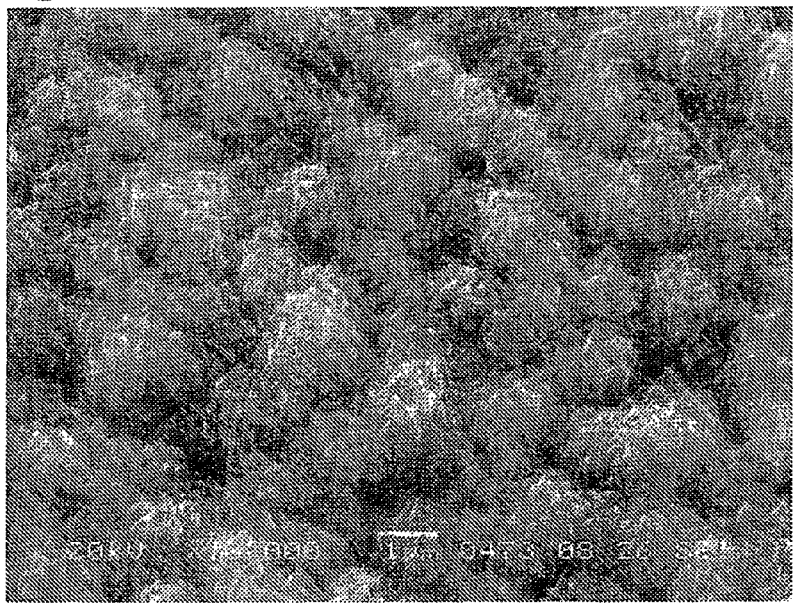
FIG. 8 is a photograph showing an SEM image of the transparent conductive film in Example 1.

A transmission electron microscope (TEM) was used to observe a cross section of the substrate with transparent conductive film over a cross section length of 3.5 μm. The top-bottom distance H2 of the irregular structure of the transparent conductive film 4 was from 40 to 200 nm, and the distance P2 between tops of the projections was from 100 to 500 nm. An SEM image of the surface of this transparent conductive film is shown in FIG. 8.

The obtained substrate with transparent conductive film 5 was introduced into a plasma enhanced CVD apparatus, and the following layers were deposited: a boron-doped p-type amorphous silicon carbide (SiC) layer 61 with thickness of 10 nm; a non-doped i-type amorphous silicon layer 62 with thickness of 300 nm; and a phosphorus-doped n-type microcrystalline silicon layer 63 with thickness of 20 nm. In this way, an amorphous silicon photoelectric conversion unit 6 was formed on the substrate.

Subsequently, the following layers were deposited by plasma enhanced CVD: a boron-doped p-type microcrystalline silicon layer 71 with thickness of 15; a non-doped i-type crystalline silicon layer 72 with thickness of 700 nm; and a phosphorus-doped n-type microcrystalline silicon layer 73 with thickness of 20 nm. In this way, an amorphous silicon photoelectric conversion unit 7 was formed. Further, as a back electrode layer 8, a zinc oxide layer 81 with thickness of 80 nm and an Ag layer 82 with thickness of 300 nm were deposited by sputtering.

From the double-junction type thin film silicon solar cell obtained as described above, the photoelectric conversion unit which had a light-receiving area of 1 cm square was separated, and photoelectric conversion properties thereof were measured. Specifically, a solar simulator having an AM 1.5 spectrum distribution was used to radiate pseudo-sunlight thereto at an energy density of 100 mW/cm$^2$ at 25° C., and output properties thereof were measured. The open circuit voltage was 1.37 V, the short circuit current density was 10.6 mA/cm$^2$, the fill factor was 69.5%, and the conversion efficiency was 10.2%. A TEM-observed photograph of cross section of this double-junction type thin film silicon solar cell is shown in FIG. 10A, and its enlarged view of the vicinity of the surface of the transparent conductive film is shown in FIG. 10B.

Example 2

A double-junction type thin film silicon solar cell was formed as Example 2 in the same way as in Example 1. However, in Example 2, the method for depositing a first transparent electrode layer 4a was different from that in Example 1.

First, an underlying layer 2 was formed onto a glass substrate 1 by a sol-gel method to form an inverse-pyramidal-irregular structure into the surface of the underlying layer by the same nano-imprinting method as in Example 1. The first transparent electrode layer 4a was deposited into a thickness of 1200 nm on the substrate on which the underlying layer was deposited by low-pressure CVD. At the time of the completion of the deposition, the supply of diethyl zinc, water, diborane, and phosphine as raw material gases was stopped, thereby interrupting deposition once. Thereafter, the raw material gases were again supplied to deposit a second transparent electrode layer 4b into a thickness of 400 nm.

AFM was used to observe the surface shape of the transparent conductive film in an area of 5 μm×5 μm. An AFM image of the surface of this transparent conductive film is shown in FIG. 7A. The top-bottom distance H2 of the irregular structure of this transparent conductive film was 45 nm, and the distance P2 between tops of the projections was 210 nm. The sheet resistance of this transparent conductive film was 15 Ω/square.

Figure 9:
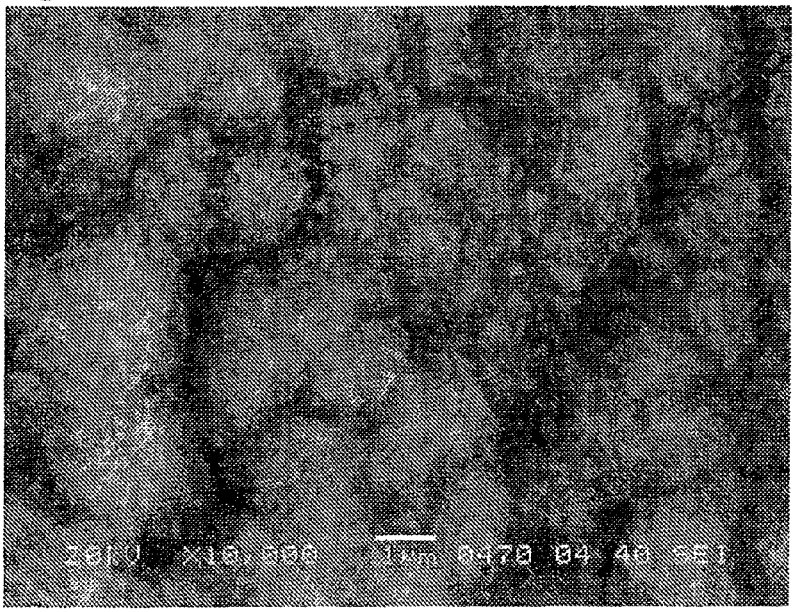
FIG. 9 is a photograph showing an SEM image of the transparent conductive film in Example 2.

A transmission electron microscope (TEM) was used to observe a cross section of the substrate with transparent conductive film over a cross section length of 3.5 μm. The top-bottom distance H2 of the irregular structure of the transparent conductive film 4 was from 40 to 200 nm, and the distance P2 between tops of the projections was from 100 to 500 nm. An SEM image of the surface of this transparent conductive film is shown in FIG. 9.

An amorphous silicon photoelectric conversion unit 6, a crystalline silicon photoelectric conversion unit 7, and a back electrode layer 8 were deposited on the obtained substrate with transparent conductive film 5 in the same manner as in Example 1.

From the double-junction type thin film silicon solar cell obtained as described above, the photoelectric conversion unit which had a light-receiving area of 1 cm square was separated, and photoelectric conversion properties thereof were measured in the same way as in Example 1. The open circuit voltage was 1.37 V, the short circuit current density was 10.7 mA/cm$^2$, the fill factor was 70.5%, and the conversion efficiency was 10.3%. A TEM-observed photograph of cross section of this double-junction type thin film silicon solar cell is shown in FIG. 11A, and its enlarged view of the vicinity of the surface of the transparent conductive film is shown in FIG. 11B.

Comparative Example 1

A double-junction type thin film silicon solar cell was formed as Comparative Example 1 in the same way as in Example 1. However, Comparative Example 1 was different from Example 1 in that no underlying layer 2 was formed and a transparent conductive film 4 was made only of a single transparent electrode layer 4b deposited by CVD, and the film thickness of the layer 4b was thicker than that of Example 1.

In other words, in Comparative Example 1, a transparent conductive film 4 (region corresponding to 4b in FIG. 2A) was deposited into a film thickness of 1500 nm on a glass substrate 1 by low-pressure CVD.

Figure 12A:
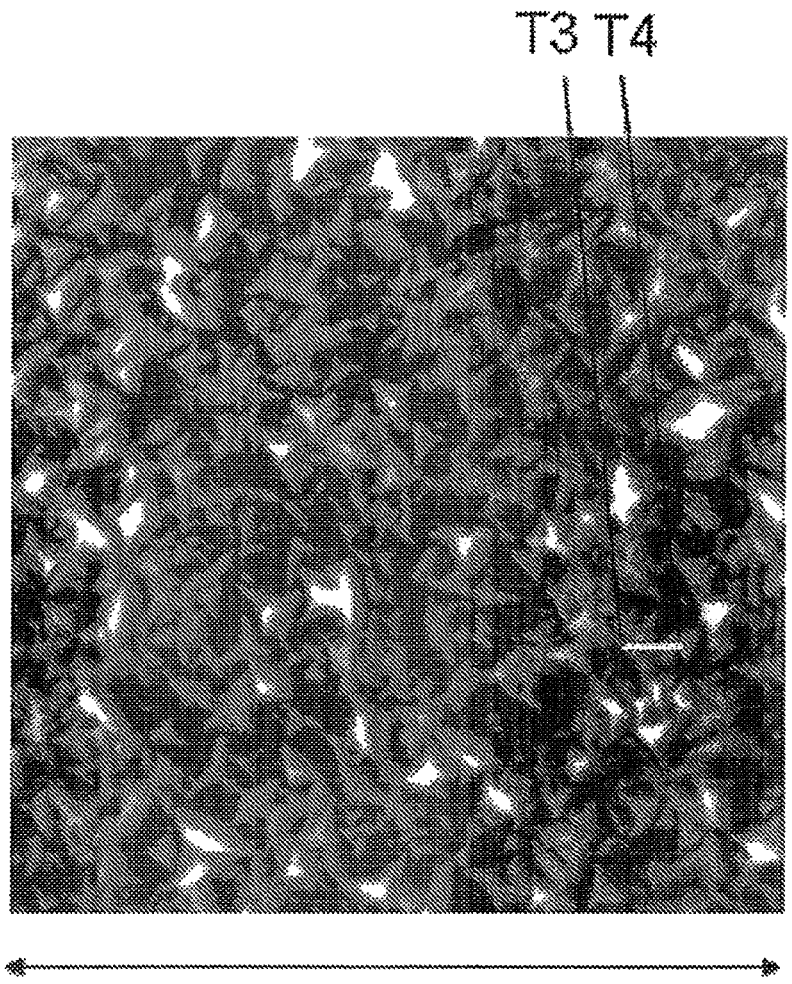
FIG. 12A is a photograph showing an AFM image of a surface irregularity structure of a transparent conductive film in Comparative Example 2.
Figure 12B:
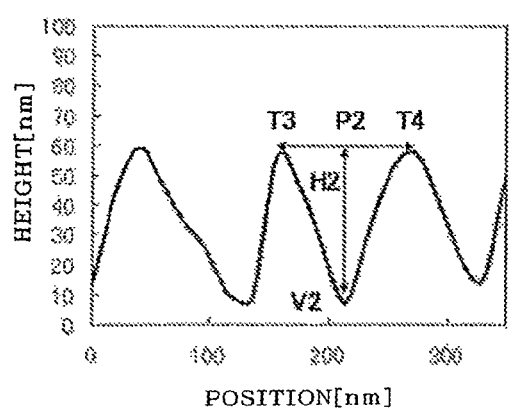
FIG. 12B is a view illustrating a sectional shape along line T3-T4 in FIG. 12A.

The surface shape of this transparent conductive film was observed in an area of 5 μm×5 μm. An AFM image of the surface of this transparent conductive film is shown in FIG. 12A. The top-bottom distance H2 of the irregular structure of this transparent conductive film was 50 nm, and the distance P2 between tops of the projections was 120 nm. The sheet resistance of this transparent conductive film was 12 Ω/square.

An amorphous silicon photoelectric conversion unit 6, a crystalline silicon photoelectric conversion unit 7, and a back electrode layer 8 were deposited on the obtained substrate with transparent conductive film 5 in the same manner as in Example 1.

From the double-junction type thin film silicon solar cell obtained as described above, the photoelectric conversion unit which had a light-receiving area of 1 cm square was separated, and photoelectric conversion properties thereof were measured in the same way as in Example 1. The open circuit voltage was 1.37 V, the short circuit current density was 9.56 mA/cm$^2$, the fill factor was 70.4%, and the conversion efficiency was 9.25%.

A comparison of Examples 1 and 2 with Comparative Example 1 demonstrates that in each of Examples 1 and 2, the underlying layer having the irregular structure formed by the nano-imprinting method was formed, so that the current density of the photoelectric conversion device was made better than that of Comparative Example 1. In the case of using a substrate having such a irregular structure large in top-bottom distance, the irregular profile of the substrate (underlying layer) is kept also in a transparent conductive film deposited thereon, thereby generating defects in a silicon layer deposited on the transparent conductive film so that the photoelectric conversion device may be made low in open circuit voltage (Voc). By contrast, as illustrated in FIGS. 10A and 11A, in each of Examples 1 and 2, the profile of the irregularity of the underlying layer was reflected on the surface shape of the transparent conductive film 4, and simultaneously the roughness was relieved. For this reason, the open circuit voltage was less declined than in Comparative Example 1.

Comparative Example 2

A double-junction type thin film silicon solar cell was formed as Comparative Example 2 in the same way as in Example 1. However, Comparative Example 2 was different from Example 1 in that no second transparent electrode layer corresponding to the reference number 4b in Example 1 was deposited, and under the same conditions as used to deposit the first transparent electrode layer 4a in Example 1, only zinc oxide doped with Al was deposited, as a transparent conductive film 4, into a thickness of 300 nm by sputtering.

AFM was used to observe the surface shape of this transparent conductive film 4. The top-bottom distance H2 of the irregular structure was 400 nm, and the distance P2 between tops of the projections was 1000 nm. The sheet resistance of this transparent conductive film was 14 Ω/square.

An amorphous silicon photoelectric conversion unit 6, a crystalline silicon photoelectric conversion unit 7, and a back electrode layer 8 were deposited on the obtained substrate with transparent conductive film 5 in the same manner as in Example 1.

From the double-junction type thin film silicon solar cell obtained as described above, the photoelectric conversion unit which had a light-receiving area of 1 cm square was separated, and photoelectric conversion properties thereof were measured in the same way as in Example 1. The open circuit voltage was 1.37 V, the short circuit current density was 8.0 mA/cm$^2$, the fill factor was 70.0%, and the conversion efficiency was 7.67%.

A comparison of Examples 1 and 2 with Comparative Example 2 demonstrates that in each of Examples 1 and 2, the zinc oxide layer as the second transparent electrode layer 4b was deposited by the low-pressure CVD, thereby a structure with irregularities having a cross section in the shape of substantial triangles and a top-bottom distance of 10 to 200 nm as illustrated in FIGS. 10B and 11B were formed in the surface of the transparent electrode layer. As a result, it appears that Examples 1 and 2 were made better in sensitivity characteristics in the range of short wavelengths than Comparative Example 2, so that a short circuit current was increased.

Figure 14:
FIG. 14 is a photograph of an SEM image of a transparent conductive film in the prior art (cited from JP-A-2005-347490).

From a comparison of the SEM images in FIGS. 8 and 9 with the SEM image in FIG. 14 according to the prior art, it is understood that in FIG. 14 the large size texture was in a roundish shape of substantial semi-spheres, while substantial pyramids were formed in the large size texture in FIGS. 8 and 9 according to examples of the invention. Moreover, in FIGS. 8 and 9, the pyramids were densely formed in the large size texture, while the area of flat regions was large in FIG. 14. Furthermore, in FIG. 14, in the small size texture, the irregularities were more roundish than in FIGS. 8 and 9.

As described above, it can be stated that in the substrate with a transparent conductive film of the invention, its irregular structure is higher in density than a conventional substrate with transparent conductive films each having a large size irregular texture and a small size irregular texture, and further the shape of the texture is suitable for an increase in light scattering and a decrease in reflection loss.

Example 3

A double-junction type thin film photoelectric conversion device as illustrated in FIG. 3 was formed as Example 3. Example 3 was different from Example 1 only in that the first transparent electrode layer 4a was changed from zinc oxide to indium-titanium composite oxide.

In the same way as in Example 1, an underlying layer and an irregular structure were formed, and then indium oxide doped with Ti was deposited, as a first transparent electrode layer 4a, into a thickness of 300 nm onto the underlying layer by sputtering. Thereafter, a transparent electrode layer 4b was deposited into a thickness of 400 nm thereon by low-pressure CVD. In this way, a transparent conductive film 4 was deposited. The deposition of the transparent electrode layer 4b was performed by CVD under the same conditions as in Example 1.

AFM was used to observe the surface shape of the transparent conductive film. The top-bottom distance H2 of the irregular structure was 90 nm, and the distance P2 between tops of the projections was 150 nm. The sheet resistance of this transparent conductive film was 10 Ω/square. The transmission electron microscope (TEM) was used to observe a cross section of the substrate with transparent conductive film over a cross section length of 3.5 µm. The top-bottom distance H2 of the irregular structure of the transparent conductive film 4 was from 40 to 200 nm, and the distance P2 between tops of the projections was from 100 to 500 nm.

An amorphous silicon photoelectric conversion unit 6, a crystalline silicon photoelectric conversion unit 7, and a back electrode layer 8 were formed on the obtained substrate with transparent conductive film 5 in the same manner as in Example 1.

From the double-junction type thin film silicon solar cell obtained as described above, the photoelectric conversion unit which had a light-receiving area of 1 cm square was separated, and photoelectric conversion properties thereof were measured in the same way as in Example 1. The open circuit voltage was 1.37 V, the short circuit current density was 10.85 mA/cm$^2$, the fill factor was 70.0%, and the conversion efficiency was 10.4%.

Comparative Example 3

A double-junction type thin film silicon solar cell was formed as Comparative Example 3 in the same way as in Example 3. However, Comparative Example 3 was different from Example 3 in that no second transparent electrode layer 4b was formed, and indium oxide doped with Ti, as a transparent conductive film 4 that was only a single layer, was formed by sputtering with a thickness of 300 nm.

AFM was used to observe the surface shape of this transparent conductive film 4. The top-bottom distance H2 of the rough structure was 400 nm, and the distance P2 between tops of the projections was 1000 nm. The sheet resistance of this transparent conductive film was 12 Ω/square.

An amorphous silicon photoelectric conversion unit 6, a crystalline silicon photoelectric conversion unit 7, and a back electrode layer 8 were formed on the obtained substrate with transparent conductive film 5 in the same manner as in Example 1.

From the double-junction type thin film silicon solar cell obtained as described above, the photoelectric conversion unit which had a light-receiving area of 1 cm square was separated, and photoelectric conversion properties thereof were measured in the same way as in Example 1. The open circuit voltage was 1.40 V, the short circuit current density was 9.0 mA/cm$^2$, the fill factor was 70.0%, and the conversion efficiency was 8.82%.

From a comparison of Example 3 with Comparative Example 3, it is understood that also when indium-titanium composite oxide is used for the first transparent electrode layer 4a, small irregularities are formed in the transparent conductive film surface in the same way as when zinc oxide is used, so that the short circuit current density is increased. Moreover, from a comparison of Example 1 with Example 3, it is understood that when indium-titanium composite oxide, which is high in transmittance in the range of long wavelengths (infrared range) as transparent electrode layer, is used, a higher short circuit current density is obtained than when zinc oxide is used.

Example 4

A double-junction type thin film silicon solar cell was formed as Example 4 in the same way as in Example 2. However, Example 4 was different from Example 2 only in that a second transparent electrode layer 4b was formed into a thickness of 600 nm in Example 4 in the formation of a transparent conductive film 4.

Figure 13A:
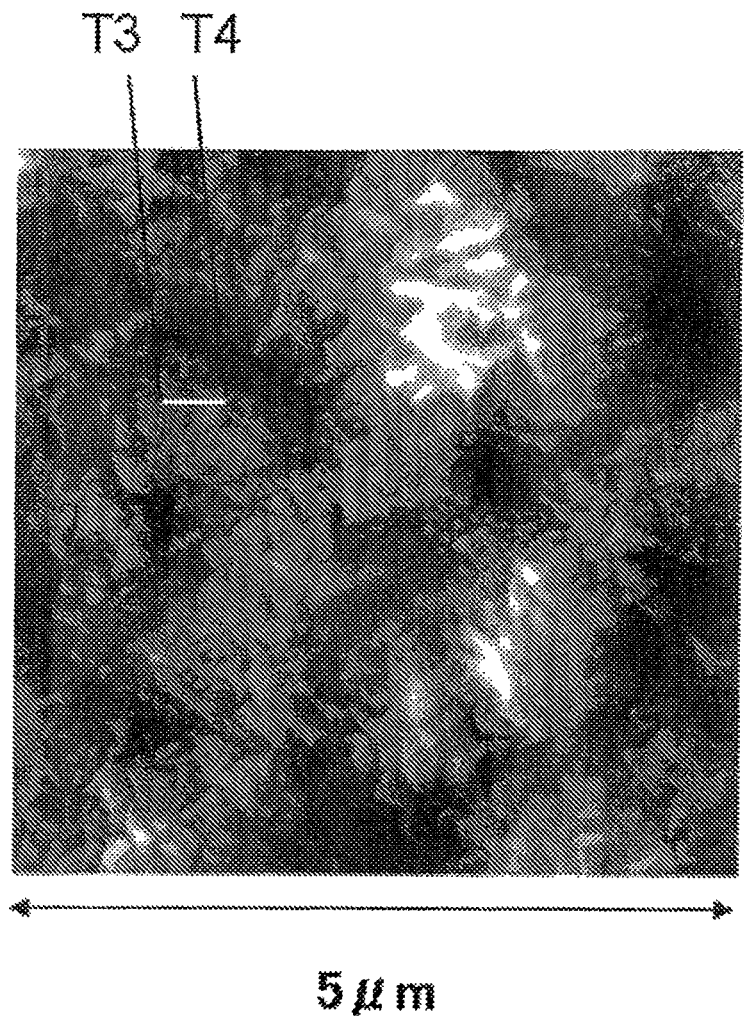
FIG. 13A is a photograph showing an AFM image of a surface irregularity structure of a transparent conductive film in Example 4.
Figure 13B:
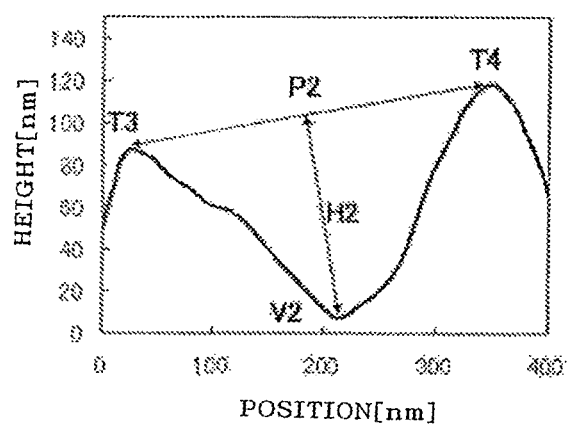
FIG. 13B is a view illustrating a sectional shape along line T3-T4 in FIG. 13A.

AFM was used to observe the surface shape of this transparent conductive film in an area of 5 μm×5 μm. An AFM image of this transparent conductive film surface is shown in FIG. 13A. The top-bottom distance H2 of the irregular structure of this transparent conductive film was 100 nm, and the distance P2 between tops of the projections was 300 nm. The sheet resistance of this transparent conductive film was 13 Ω/square.

An amorphous silicon photoelectric conversion unit 6, a crystalline silicon photoelectric conversion unit 7, and a back electrode layer 8 were formed on the obtained substrate with transparent conductive film 5 in the same manner as in Example 1.

From the double-junction type thin film silicon solar cell obtained as described above, the photoelectric conversion unit which had a light-receiving area of 1 cm square was separated, and photoelectric conversion properties thereof were measured in the same way as in Example 1. The open circuit voltage was 1.37 V, the short circuit current density was 10.6 mA/cm², the fill factor was 70.0%, and the conversion efficiency was 10.2%.

From a comparison of Example 2 with Example 4, it is understood that when the thickness of the second transparent electrode layer 4b is varied, the surface shape of the irregular structure of the transparent conductive film can be adjusted. In other words, it is understood that when the thickness of the second transparent electrode layer 4b is made large, the top-bottom distance H2 becomes large and fine irregularities of the transparent conductive film surface turn into a steeper form.

A list of the photoelectric conversion properties of the photoelectric conversion devices of Examples 1 to 4 and Comparative Examples 1 to 3 is shown in Table 1.

TABLE 1

|  | Open circuit voltage (V) | Short circuit current density (mA/cm²) | Fill factor (%) | Conversion efficiency (%) |
| --- | --- | --- | --- | --- |
| Example 1 | 1.37 | 10.6 | 69.5 | 10.2 |
| Comparative Example 1 | 1.37 | 9.56 | 70.4 | 9.25 |
| Comparative Example 2 | 1.37 | 8.00 | 70.0 | 7.67 |
| Example 2 | 1.37 | 10.70 | 70.5 | 10.3 |
| Example 3 | 1.37 | 10.85 | 70.0 | 10.4 |
| Comparative Example 3 | 1.40 | 9.00 | 70.0 | 8.82 |
| Example 4 | 1.37 | 10.6 | 70.0 | 10.2 |

Example 5

As Example 5, an organic EL element as illustrated in FIG. 4 was produced. First, an underlying layer 2 and a transparent conductive film 4 were formed in the same way as in Example 1. This substrate was transported into a deposition chamber of a vacuum evaporation machine, and then N,N'-diphenyl-N'-bis(3-methylphenyl)-1,1'-diphenyl-4,4'-diamine was used as an evaporation source to form a film about 500 Å in thickness. In this way, a hole transporting layer 9 was formed.

Subsequently, tris(8-hydroquinoline)aluminum was used as an evaporation source to be evaporated and deposited into a thickness of about 500 Å. In this way, a luminescent layer 10 was formed. Subsequently, lithium fluoride was used as an evaporation source to be evaporated and deposited, as an alkali metal layer 12, into a thickness of about 15 Å. Furthermore, aluminum was used as an evaporation source to be evaporated and deposited, as a metal layer 13, into a thickness of 2500 Å. In this way, a cathode layer 11 was formed. A DC voltage of 13 V was applied to the obtained organic EL element. It was verified that the element emitted green uniform luminescence with a front luminance of 3800 cd/m².

Comparative Example 4

As Comparative Example 4, an organic EL element was produced in the same way as in Example 5. Comparative Example 4 was different from Example 5 only in that no underlying layer 2 of the substrate with transparent conductive film was present. In other words, a transparent conductive film 4 was deposited onto a glass substrate, and then in the same way as in Example 5, a hole transporting layer, a luminescent layer, and a cathode layer were stacked thereon in this order. A DC voltage of 13 V was applied to the obtained organic EL element. It was verified that the element emitted green uniform luminescence with a front luminance of 2000 cd/m².

In Comparative Example 4, the luminance was lower than Example 5. This appears to be based on the following: when the underlying layer 2 is present, light is scattered so that light is less confined in the substrate, whereby the luminescence intensity from the element is increased; however, when no underlying layer 2 is present, light is confined in the element, so that the luminance is lowered.

EXPLANATION OF REFERENCE NUMERALS 1 transparent insulating substrate
2 underlying layer
3 mold
4 transparent conductive film
4a transparent electrode layer
4b transparent electrode layer
5 substrate with transparent conductive film
6 amorphous silicon photoelectric conversion unit
61 p-type amorphous silicon carbide layer
62 i-type amorphous silicon layer
63 n-type microcrystalline silicon layer
7 crystalline silicon photoelectric conversion unit
71 p-type microcrystalline silicon layer
72 i-type crystalline silicon layer
73 n-type microcrystalline silicon layer
8 back electrode layer
81 zinc oxide layer
82 Ag layer
9 hole transporting layer
10 luminescent layer
11 cathode layer
12 alkali metal layer
13 metal layer

The invention claimed is:

1. A method for producing a substrate with a transparent conductive film, comprising:
   forming an underlying layer on the substrate;
   forming pyramidal shape or inverse-pyramidal shape irregular structures on a transparent conductive film-side surface of the underlying layer; and
   forming the transparent conductive film directly on the underlying layer by:
      forming a first transparent electrode layer, the first transparent electrode layer being formed on the transparent conductive film-side surface of the underlying layer, and
      forming, by low-pressure CVD, a second transparent electrode layer forming an outermost surface of the transparent conductive film, the second transparent electrode layer including zinc oxide, the second transparent electrode layer having irregular structures formed on the surface of the second transparent electrode layer that are smaller in size than the pyramidal shape or the inverse-pyramidal shape irregular structures of the underlying layer,
   wherein the low-pressure CVD is conducted at a lower pressure than atmospheric pressure.

2. The method according to claim 1, wherein forming the first transparent electrode layer further comprises forming the first transparent electrode layer by low-pressure CVD, and wherein forming the transparent conductive film further comprises temporarily interrupting low-pressure CVD after forming the first transparent electrode layer and before forming the second transparent electrode layer.

3. The method according to claim 1, wherein the first transparent electrode layer is deposited by a sputtering method.

4. The method according to claim 1, wherein the irregular structures of the underlying layer are formed by a nano-imprinting method.

5. The method according to claim 4, wherein the irregular structures of the underlying layer are formed by the nano-imprinting method, which is a method of transcribing a rough structure to the underlying layer, the rough structure formed by etching a monocrystalline silicon substrate.

6. The method according to claim 1, wherein the first transparent electrode layer comprises a metal oxide.

7. The method according to claim 1, wherein the first transparent electrode layer comprises tin oxide, zinc oxide, ITO, or indium-titanium composite oxide.

8. The method according to claim 1, wherein the first transparent electrode layer comprises indium-titanium composite oxide.

9. The method according to claim 1, wherein the first transparent electrode layer comprises zinc oxide.

10. The method according to claim 1, wherein the underlying layer comprises $SiO_2$ as a main component.

11. The method according to claim 1, wherein the second transparent electrode layer is formed directly on the first transparent electrode layer.

12. The method according to claim 1, wherein the pyramidal shape or the inverse-pyramidal shape irregular structure is continuously formed on the transparent conductive film-side surface of the underlying layer.

13. The method according to claim 1, wherein a top-bottom distance of the irregular structure of the underlying layer is larger than that of the irregular structure of the transparent conductive film, and wherein a distance between tops of projections of the irregular structure of the underlying layer is larger than that between tops of projections of the transparent conductive film.

14. The method according to claim 1, wherein
   for the irregular structure of the underlying layer, a top-bottom distance is from 100 to 1000 nm, and a distance between tops of projections is from 200 to 2000 nm, and
   for the irregular structure of the transparent conductive film, the top-bottom distance is from 20 to 400 nm, and the distance between the tops of the projections is from 50 to 1000 nm.

15. The method according to claim 1, further comprising:
   stacking two or more photoelectric conversion units having absorbable wavelength ranges different from each other, and a back electrode layer in this order on the transparent conductive film.

16. The method according to claim 15, wherein
   as the photoelectric conversion units, at least one amorphous silicon photoelectric conversion unit and a crystalline silicon photoelectric conversion unit are arranged in this order from a light incident side.

17. The method according to claim 1, further comprising:
   stacking a light emitting layer formed of an organic thin film layer on the transparent conductive film.

* * * * *